(12) United States Patent
Shon

(10) Patent No.: US 10,527,658 B2
(45) Date of Patent: Jan. 7, 2020

(54) POWER MONITORING SYSTEM AND METHOD FOR MONITORING POWER THEREOF

(71) Applicant: LSIS CO., LTD., Gyeonggi-do (KR)

(72) Inventor: Sang-Ki Shon, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 15/254,973

(22) Filed: Sep. 1, 2016

(65) Prior Publication Data

US 2017/0067948 A1    Mar. 9, 2017

(30) Foreign Application Priority Data

Sep. 3, 2015    (KR) .................. 10-2015-0125181

(51) Int. Cl.
*G01R 22/06* (2006.01)
*H02J 3/38* (2006.01)

(52) U.S. Cl.
CPC ............ *G01R 22/063* (2013.01); *H02J 3/382* (2013.01); *Y02B 90/246* (2013.01)

(58) Field of Classification Search
CPC ....... G01R 22/063; G01R 22/10; H02J 3/381; H02J 3/382; H02J 3/383; Y02B 70/3266; Y02B 70/3216; Y02B 90/246
See application file for complete search history.

(56) References Cited

U.S. PATENT DOCUMENTS

| 9,118,211 B2 | 8/2015 | Ichikawa | |
|---|---|---|---|
| 9,559,521 B1* | 1/2017 | King | H02J 7/34 |
| 2009/0027932 A1* | 1/2009 | Haines | H02J 9/062 |
| | | | 363/95 |
| 2012/0072141 A1* | 3/2012 | Hidai | G01R 19/2516 |
| | | | 702/60 |
| 2012/0130556 A1* | 5/2012 | Marhoefer | H02J 3/32 |
| | | | 700/291 |
| 2012/0153722 A1* | 6/2012 | Nazarian | H02J 3/32 |
| | | | 307/23 |

(Continued)

FOREIGN PATENT DOCUMENTS

| CN | 106405216 A | 2/2017 |
|---|---|---|
| EP | 2475068 A1 | 7/2012 |

(Continued)

OTHER PUBLICATIONS

European Search Report dated Feb. 13, 2017 issued in corresponding the counterpart European Patent Application.

(Continued)

*Primary Examiner* — Son T Le
*Assistant Examiner* — Dustin R Dickinson
(74) *Attorney, Agent, or Firm* — K&L Gates LLP

(57) ABSTRACT

Disclosed embodiments relate to a power monitoring system that may include an external power supply source, an energy storage system, a renewable energy source and a distribution board. In some embodiments, the power monitoring system includes the renewable energy source, the energy storage system, the distribution board, a first power metering device, a second power metering device, a third power metering device, a fourth power metering device and a server.

8 Claims, 22 Drawing Sheets

(56) References Cited

U.S. PATENT DOCUMENTS

| | | | |
|---|---|---|---|
| 2013/0234520 A1* | 9/2013 | Dierksheide | H02J 3/382 307/65 |
| 2013/0238266 A1* | 9/2013 | Savvides | G06Q 50/06 702/61 |
| 2013/0290232 A1 | 10/2013 | Tsytsarau et al. | |
| 2014/0084687 A1 | 3/2014 | Dent | |
| 2014/0159485 A1* | 6/2014 | Daniel | H02J 1/14 307/24 |
| 2015/0005978 A1* | 1/2015 | Nakakita | H02J 3/14 700/297 |
| 2016/0226252 A1* | 8/2016 | Kravtiz | H02M 7/003 |

FOREIGN PATENT DOCUMENTS

| | | |
|---|---|---|
| EP | 2511716 A1 | 10/2012 |
| EP | 2701266 A1 | 2/2014 |
| EP | 2735847 A2 | 5/2014 |
| JP | 2000314752 A | 11/2000 |
| JP | 2001268801 A | 9/2001 |
| JP | 2011-172454 A | 9/2011 |
| JP | 2012-29536 A | 2/2012 |
| JP | 2012-186963 A | 9/2012 |
| JP | 2013013174 A | 1/2013 |
| JP | 2013031243 A | 2/2013 |
| JP | 2013-102281 A | 5/2013 |
| JP | 2013-213825 A | 10/2013 |
| JP | 2014011863 A | 1/2014 |
| JP | 2014-39352 A | 2/2014 |
| JP | 5641083 B2 | 11/2014 |
| JP | 5690618 B2 | 2/2015 |
| KR | 101015133 B1 | 2/2011 |
| KR | 20130002081 A | 1/2013 |
| KR | 20130070132 A | 6/2013 |
| KR | 101316026 B1 | 10/2013 |
| KR | 101391876 B1 | 5/2014 |
| KR | 20140132523 A | 11/2014 |
| KR | 20150011224 A | 1/2015 |
| KR | 201500319926 A | 3/2015 |
| KR | 101527194 B1 | 6/2015 |

OTHER PUBLICATIONS

Japanese Office Action dated Apr. 4, 2017 in connection with the counterpart Japanese Patent Application No. 2016-164285.

Korean Office Action dated Nov. 18, 2016 corresponding to application No. 952016083250629.

Japanese Notice of Allowance dated Aug. 1, 2017 in connection with the counterpart Japanese Patent Application.

Chinese Office Action dated Oct. 9, 2018 in corresponding Chinese Patent Application No. 201610758035.0.

Yu Yixin, et al.; Nonintrusive Residential Load Monitoring and Decomposition Technology; Southern Power System Technology; China Academic Journal Electronic Publishing House; 2013, vol. 7, No. 4; Key Laboratory of Smart Grid of Education Ministry, Tianjin University, Tianjin 300072, China; State Grid Smart Grid Research Institute, Beijing 100085, China; 5 Pages.

* cited by examiner

PRIOR ART

POWER MONITORING SYSTEM AND METHOD FOR MONITORING POWER THEREOF

CROSS REFERENCE TO RELATED APPLICATIONS

This application claims the benefit of Korean Patent Application No. 10-2015-0125181, filed on Sep. 3, 2015 and entitled "POWER MONITORING SYSTEM AND METHOD FOR MONITORING POWER THEREOF", which is hereby incorporated by reference in its entirety.

BACKGROUND

Technical Field

The present disclosure relates to a power monitoring system and a method for monitoring power thereof.

Description of the Related Art

With development of digital technology and network technology, consumer electronics and information devices have been developed to have various functions according to technology convergence/combination. Such digital multifunctional devices have come into wide use at home and offices. However, supporting functional convergence/combination and networking functions cause the consumer electronics and information devices to consume power by a user's request and standby power unnoticed by their users.

However, since users are not able to know how much power any specific one of their devices consumes over a specific period, they do not feel the need to save the electrical energy.

To address this problem, a technology to analyze and monitor the amount of power consumption and power consumption pattern of each electronic device over a specific period by means of a meter for measuring the total amount to power consumption per household and building in relation to monitoring of energy consumed by each electronic device has been introduced.

FIG. 1 is a block diagram of a conventional system for monitoring power consumed by loads.

Referring to FIG. 1, in the conventional system for monitoring power consumed by loads, the power supplied from an external power supply source 1 to each household 3 may be supplied to home appliances connected to receptacles via a distribution board 2 installed in each household 3. In particular, the distribution board 2 includes a power metering device 4 to check the power usage and the amount of power consumption of the home appliances in the household 3 which consume the power supplied from the external power supply source 1.

The aforementioned power metering device 4 may use the information about the power usage and power consumption patterns of the home appliances to monitor the home appliances individually through a remote server.

Recently, power generation sources or energy sources other than the external power supply source 1 have been increasingly used to supply power to home appliances in the household 3. Typical examples of the power generation sources or energy sources other than the external power supply source 1 may include a renewable energy source, such as a solar power generation system, and an energy storage system.

The conventional system for monitoring power consumed by loads is incapable of detecting additional power supplied from a renewable energy source and an energy storage system connected thereto. Accordingly, it is not possible to comprehensively monitor power production and consumption in the household 3 in consideration of not only home appliances in the household but also the additional power supplied from the energy storage system and renewable energy source.

SUMMARY

It is an aspect of some embodiments in the present disclosure to provide a power monitoring system capable of comprehensively monitoring the consumption state of power supplied to loads and the power production state of an energy storage system and renewable energy source when the energy storage system and renewable energy source as well as the conventional external power supply source are provided and a method for monitoring power thereof.

In accordance with one aspect of some embodiments in the present disclosure, a power monitoring system includes an external power supply source configured to apply power, a renewable energy source configured to generate power and apply the generated power to an energy storage system (ESS), the ESS configured to store at least one of the power applied by the external power supply source and the power applied by the renewable energy source and to discharge the stored power to the distribution board, a distribution board configured to distribute the power applied from at least one of the external power supply source and the ESS to at least one load, a first power metering device connected to an output of the external power supply source and configured to detect or determine first power data applied from the external power supply source, a second power metering device connected to an input of the distribution board and configured to detect or determine second power data distributed from the distribution board to the load, a third power metering device connected to an input of the ESS and configured to detect or determine third power data applied to the ESS, a fourth power metering device connected to an output of the renewable energy source and configured to detect or determine fourth power data applied from the renewable energy source to the ESS, and a server configured to monitor power based on at least one of the first power data, the second power data, the third power data and the fourth power data.

In accordance with another aspect of some embodiments in the present disclosure, a power monitoring system includes an external power supply source configured to apply power, a distribution board configured to distribute the power applied from the external power supply source to an energy storage system (ESS), a least one load, or both, a renewable energy source configured to generate power and apply the generated power to the ESS, the ESS configured to store at least one of the power applied by the external power supply source and the power applied by the renewable energy source and to apply the stored power to the load via the distribution board, a first power metering device configured to detect or determine first power data applied from the external power supply source, a second power metering device configured to detect or determine second power data distributed to at least one of the load and the ESS, a third power metering device configured to detect or determine third power data distributed from the distribution board and applied to the ESS, a fourth power metering device configured to detect or determine fourth power data applied from the renewable energy source to the ESS, and a server configured to monitor power based on at least one of the first power data, the second power data, the third power data and the fourth power data.

DETAILED DESCRIPTION

Hereinafter, a power monitoring system and a method for a monitoring power in thereof according to embodiments of the present disclosure will be described in detail with reference to the accompanying drawings. It should be understood that the present disclosure is not limited to the following embodiments, and that some embodiments are provided for illustrative purposes only. The scope of the disclosure should be defined only by the accompanying claims and equivalents thereof.

Figure 1:
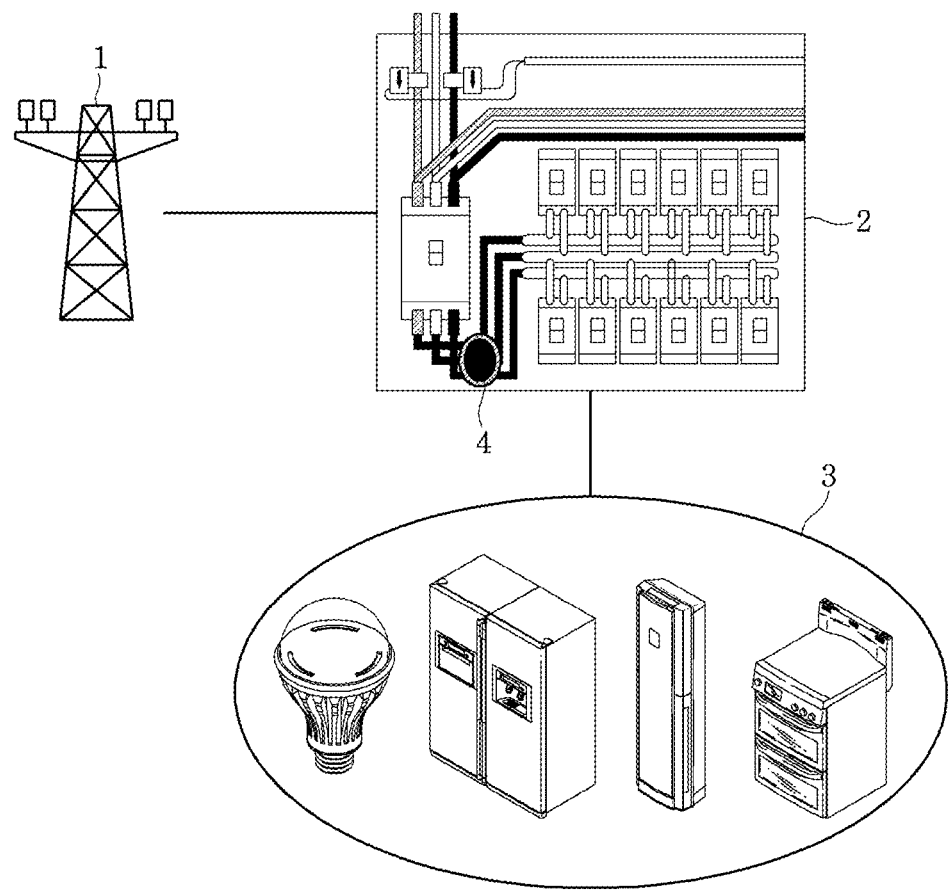
FIG. 1 is a block diagram illustrating a conventional system for monitoring power consumed by loads, according to the prior art.
Figure 2:
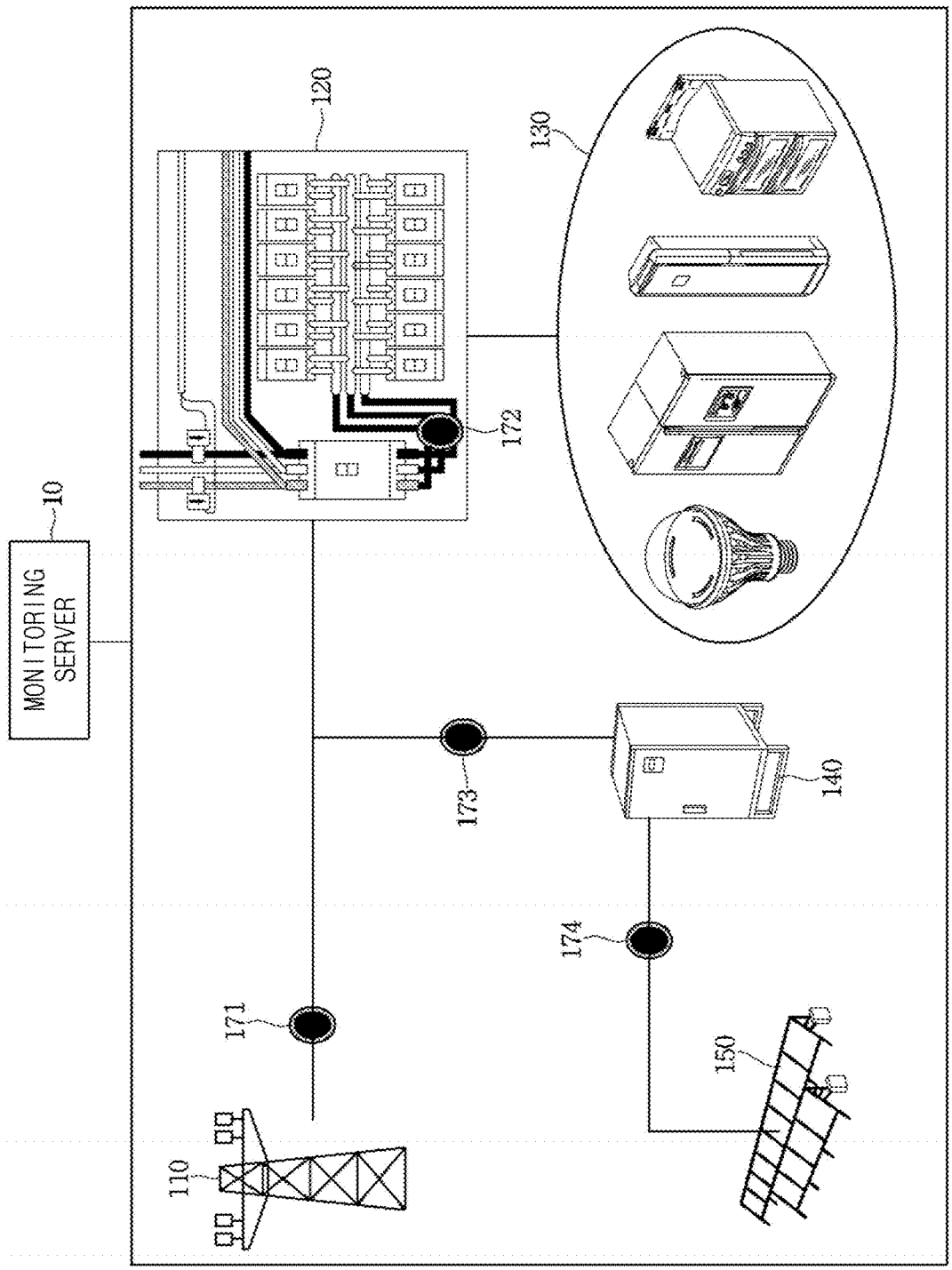
FIG. 2 is a block diagram illustrating a system for monitoring power consumed by loads in accordance with some embodiments of the present disclosure.

FIG. 2 is a block diagram illustrating a system for monitoring power consumed by loads in accordance with some embodiments of the present disclosure.

Referring to FIG. 2, the system for monitoring power consumed by loads according to some embodiments of the present disclosure includes a monitoring server 10, an external power supply source 110, a distribution board 120, loads 130, an energy storage system (ESS) 140 and a renewable energy source 150. In particular, the outputs or inputs of the external power supply source 110, the distribution board 120, the ESS 140 and the renewable energy source 150 may include power metering devices 171, 172, 173 and 174 respectively to detect power data input to or output from the aforementioned components.

While the loads 130 are described below as being electronic devices, embodiments of the present disclosure are not limited thereto. The loads 130 may refer to all devices capable of consuming power supplied thereto.

Although the renewable energy source 150 is illustrated as being a photovoltaic power generation system in some embodiments of the present disclosure, embodiments of the present disclosure are not limited thereto. The renewable energy source may represent all devices capable of generating and discharging power.

The monitoring server 10 may obtain power data containing the amounts of power consumption, applied power or power consumption patterns of loads and power sources measured by the power metering devices 171, 172, 173 and 174. In addition, the monitoring server 10 may monitor and output, based on the obtained data, the power supplied to the whole system, power consumption of the whole system, and power consumption and operational statuses of the individual loads in the system.

Figure 20:
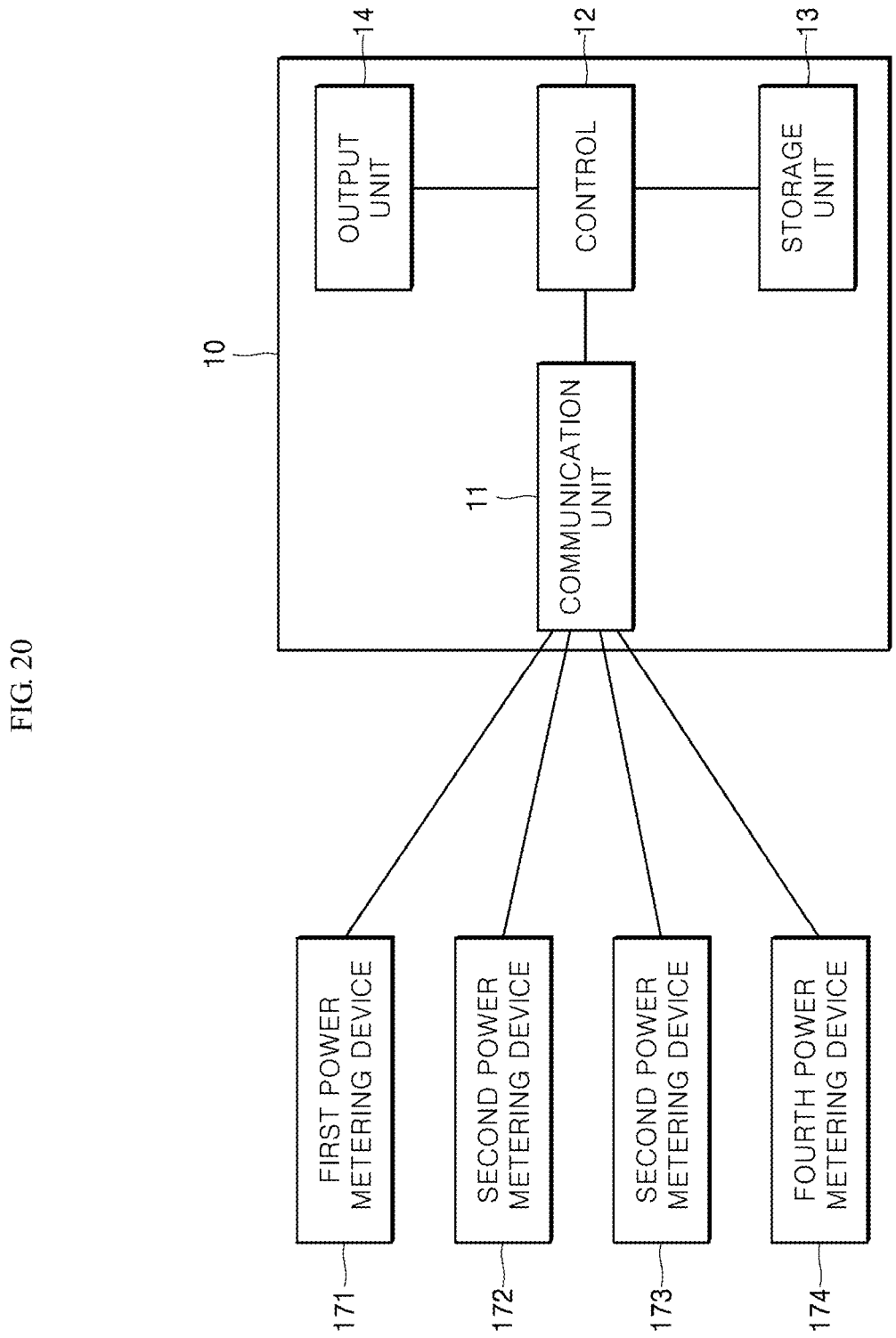
FIG. 20 is a block diagram illustrating a monitoring server according to some embodiments of the present disclosure.

FIG. 20 is a block diagram illustrating a monitoring server according to some embodiments of the present disclosure.

Referring to FIG. 20, the monitoring server 10 according to some embodiments of the present disclosure may include a communication unit 11, a controller 12, a storage unit 13, and an output unit 14.

The communication unit 11 may include one or more modules for enabling wireless or wired communication with the power metering devices 171, 172, 173, 174 and 175 or between external apparatuses.

The communication unit 11 may be configured in the form of a wireless Internet module employing WLAN (Wireless LAN) (Wi-Fi), Wibro (Wireless broadband), WiMAX (World Interoperability for Microwave Access) and HSDPA (High Speed Downlink Packet Access), Bluetooth, or RFID (Radio Frequency Identification). Moreover, the communication unit 11 may be configured in various forms, for example, a short range communication module employing IrDA (Infrared Data Association), UWB (Ultra Wideband) or ZigBee and a wired communication module. The communication unit 11 may receive power data from the power metering devices 171, 172, 173, 174 and 175.

Herein, the power data may include the amount of power input, the amount of power consumption, a power consumption pattern and power consumption patterns of individual loads.

The controller 12 may monitor the power of the system using the power data of the power metering devices 171, 172, 173, and 174 received by the communication unit 11.

Specifically, the controller 12 may acquire at least one of the amount of power input, the amount of power consumption and a power consumption pattern using the power data received from the power metering devices.

The controller 12 may also extract power consumption patterns of the individual loads from the received power data, and acquire the operational statuses and the amount of power consumption of the individual loads using the extracted power consumption patterns of the individual loads.

The controller 12 may analyze the power consumption patterns using the (non-intrusive load monitoring) NILM algorithm. Specifically, when the controller 12 receives power data from the power metering devices, the controller 12 may analyze the received power data using the NILM algorithm, thereby acquiring at least one of the amount of power input, the amount of power consumption, a power consumption pattern, operational statuses of individual loads and the amounts of power consumption of the individual loads. Herein, the NILM algorithm refers to an algorithm capable of measuring the amounts of power consumption of individual loads connected to a specific point supplied with power, using data measured at the specific point.

The controller 12 may store the received power data, a result acquired by analyzing the received power data and information about the corresponding power metering devices in the storage unit 13 or output the same using the output unit 14.

The storage unit 13 may store an algorithm for analysis of power usage patterns executed in the controller 12. Examples of the storage unit 13 include at least one type of storage medium from among flash memory type, hard disk type, multimedia card-micro type, card-type memory (e.g., SD or XD memory), RAM (Random Access Memory), SRAM (Static Random Access Memory), ROM (Read-Only Memory), EEPROM (Electrically Erasable Programmable Read-Only Memory), PROM (Programmable Read-Only Memory), magnetic memory, magnetic disk and optical disk types.

The output unit 14 may output the result of analysis of the power data in various forms, for example, video or audio data on the basis of control by the controller 12. Examples of the output unit 14 may include a display unit and an audio output unit.

Additionally, a user input unit (not shown) may be configured, and it is possible to control the server 10 or output at least one of the amount of power input, the amount of power consumption, a power consumption pattern, operational statuses of individual loads and the amounts of power consumption of the individual loads on the basis of the input through the user input unit.

Referring back to FIG. 2, the power monitoring system according to some embodiments may include the external power supply source 110, the distribution board 120, the electronic devices 130, the ESS 140 and the renewable energy source 150.

The power from the external power supply source 110, which is an external power generation source such as a power plant, may be supplied to various loads including the electronic devices 130 in a household through the distribution board 120. The power from the external power supply source 110 may also be applied to the ESS 140 and used to charge the ESS 140.

The distribution board 120 may distribute power from the external power supply source 110 or the ESS 140 such that the power is applied to various loads such as the electronic devices 130 in a household.

The ESS 140 stores the power from the external power supply source 110 or the power applied by the renewable energy source 150. The ESS may allow the stored power to be applied to the electronic device 130 via the distribution board 120 at a specific time (or when a user requests power application). For example, power may be stored in the ESS 140 during hours when power consumption is low or the electricity rate is low, for example, during late-night hours. Then, the stored power may be discharged to the electronic devices 130 during hours when demand for electricity surges or the electricity rate is high.

A photovoltaic power generation system may be configured as the renewable energy source 150. The photovoltaic power generation system may convert incident solar light into electric power and apply the power to the ESS 140.

The power metering devices 171, 172, 173 and 174 may be connected to the output of the external power supply source 110, the input of the distribution board 120, the input of the ESS 140 and the output of the renewable energy source 150, respectively.

A first power metering device 171 connected to the output of the external power supply source 110 may include at least one module capable of measuring the power supplied from the external power supply source 110.

Further, the first power metering device 171 may include at least one module capable of measuring the total amount of power consumption of the loads and the ESS 140 and an overall power consumption pattern when the power from the external power supply source 110 is supplied to a plurality of loads such as the electronic devices 130 and the ESS 140.

Further, the first power metering device 171 may measure power consumption patterns of the respective loads and a power consumption pattern of the ESS 140. These power consumption patterns may be analyzed using the NILM algorithm. Thereby, the power consumption patterns may be used to acquire at least one of the amount of power consumed by each of the loads, operational status information about each of the loads, the amount of power consumed by the ESS 140 and operational status information about the ESS 140.

A second power metering device 172 connected to the input of the distribution board 120 may include at least one module capable of measuring the total amount of power consumption of a plurality of loads such as the electronic devices 130 in a household when at least one of the power from the external power supply source 110 and the power from the ESS 140 is supplied to the loads. Specifically, the second power metering device 172 may be connected to the input of the distribution board 120 to detect second power data distributed from the distribution board 120 to the electronic devices 130 in a household.

The second power metering device 172 may also measure power consumption patterns of the respective loads. Thereafter, the power consumption patterns of the loads may be analyzed using the NILM algorithm. Thereby, the power consumption patterns may be used to acquire at least one of the amount of power consumed by each of the loads, operational status information about each of the loads, and power consumption pattern information about each of the loads.

A third power metering device 173 connected to the input of the ESS 140 may include at least one module capable of measuring the amount of power stored in the ESS 140 or the amount of power discharged from the ESS 140.

The third power metering device 173 may also include at least one module capable of measuring a power consumption pattern of the ESS 140. The power consumption pattern of the ESS 140 may be analyzed using the NILM algorithm. Thereby, the power consumption pattern of the ESS 140 may be used to acquire at least one of the amount of power stored in or discharged from the ESS 140 and operational status information about the ESS 140.

A fourth power metering device 174 connected to the output of the renewable energy source 150 includes at least one module capable of measuring power data about power generated by the renewable energy source 150. Specifically, the fourth power metering device 174 may be installed at a point at which the renewable energy source 150 and the ESS 140 are connected. Thereby, the fourth power metering device 174 may check the power data applied from the renewable energy source 150 to the ESS 140.

Hereinafter, a detailed description will be given of a method for monitoring power consumed by loads based on the configuration of the power monitoring system including the power metering devices described above according to some embodiments of the present disclosure, with reference to FIGS. 3 to 10. Although the method for monitoring power described below is limited to a sequence of collecting data, it should be noted that the data may be collected from the respective power metering devices, irrespective of the sequence of collecting data.

FIGS. 3 to 10 are flowcharts illustrating methods for monitoring power in a power monitoring system according to some embodiments of the present disclosure.

Figure 3:
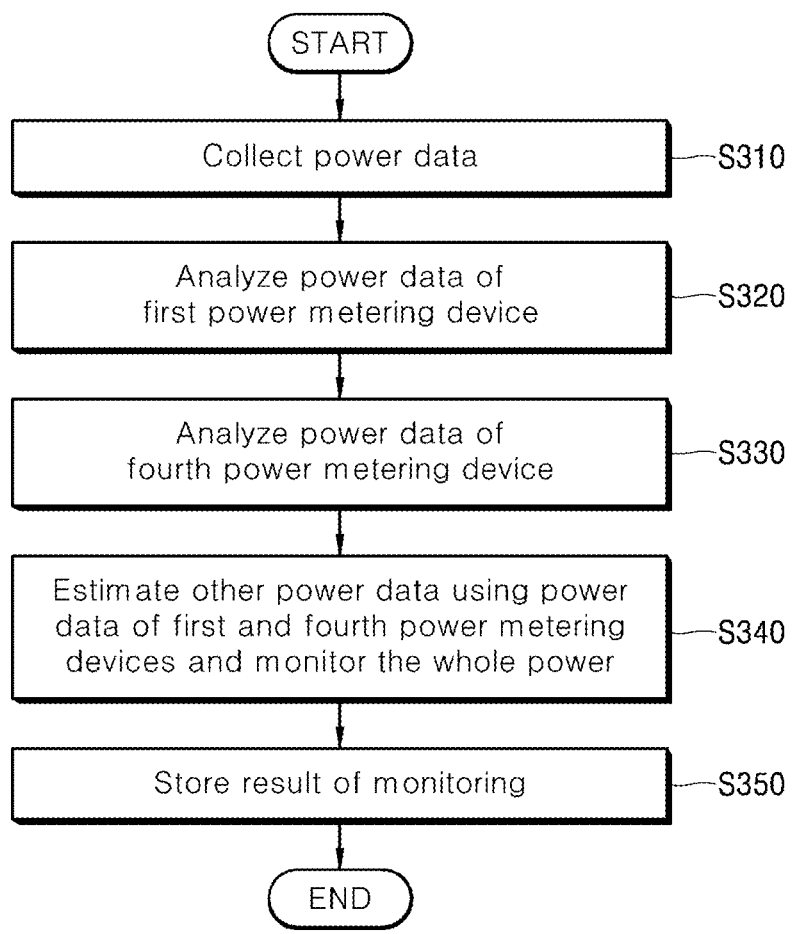
FIGS. 3 and 4 are flowcharts illustrating a method for monitoring power when an energy storage system operates in a DC charge mode according to some embodiments of the present disclosure.

FIG. 3 is a flowchart illustrating a method for monitoring power in the monitoring server 10 using first power data detected by the first power metering device and fourth power data detected by the fourth power metering device when the ESS operates in a DC charge mode.

Herein, the DC charge mode may be a mode in which the ESS 140 does not store power applied from the external power supply source 110, but stores only DC power applied from the renewable energy source 150.

Referring to FIG. 3, the monitoring server 10 may collect power data via the communication unit 11 (S310). Specifically, the monitoring server 10 may receive first power data from the first power metering device 171 provided to the output of the external power supply source 110 and fourth power data from the fourth power metering device 174 provided to the output of the renewable energy source 150.

In FIG. 2, the second power metering device 172 is illustrated as being provided to the input of the distribution board 120 and the third power metering device 173 is provided to the input of the ESS 140. Since the second power data of the second power metering device 172 and the third power data of the third power metering device 173 can be estimated based on the first power data and fourth power data, power may be monitored without using the second and third power data in some embodiments.

The controller 12 of the monitoring server 10 may analyze the first power data of the first power metering device 171 collected via the communication unit 11 (S320).

In this case, the first power data may contain information about the amount of power applied from the external power supply source 110.

The first power data may also contain the total amount of power consumption of the plurality of electronic devices 130 and a total power consumption pattern. Further, the first power data may contain power consumption patterns of the individual electronic devices constituting the plurality of electronic devices 130.

The controller 12 of the monitoring server 10 may analyze the fourth power data of the fourth power metering device 174 collected via the communication unit 11 (S330).

In this case, the fourth power data of the fourth power metering device 174 may contain the amount of power generated and applied to the ESS 140 by the renewable energy source 150, namely the DC power generated by the renewable energy source 150 and stored in the ESS 140.

The controller 12 of the monitoring server 10 may estimate the second power data and third power data based on the first power data detected by the first power metering device 171 and the fourth power data detected by the fourth power metering device 174, and monitor the power of the system (S340).

Specifically, the controller 12 may acquire the amount of power applied from the external power supply source 110 using the first power data detected by the first power metering device 171. The controller 12 may also acquire at least one of the amount of power consumption of each individual electronic device constituting the plurality of electronic devices 130 and the operational status information about the individual electronic devices, using the first power data detected by the first power metering device 171. The controller 12 may also acquire the amount of power charge applied from the renewable energy source 150 and stored in the ESS 140, using the fourth power data detected by the fourth power metering device 174. In this case, the NILM algorithm may be used.

The controller 12 of the monitoring server 10 may estimate at least one of the second power data and third power data using the first power data detected by the first power metering device 171 and the fourth power data detected by the fourth power metering device 174. Specifically, when the ESS 140 is in the DC charge mode, the ESS 140 is not supplied with any power from the external power supply source 110. Nor does the ESS 140 discharge power to the distribution board 120. Accordingly, the controller 12 may estimate that the second power data is identical to the first power data and that there is no applied power for the third power data.

The monitoring server 10 may monitor the power of the whole system using other power data estimated using the first power data, the fourth power data and first power data, or the fourth power data.

The controller 12 may store the result of monitoring in the storage unit 13 (S350).

Figure 4:
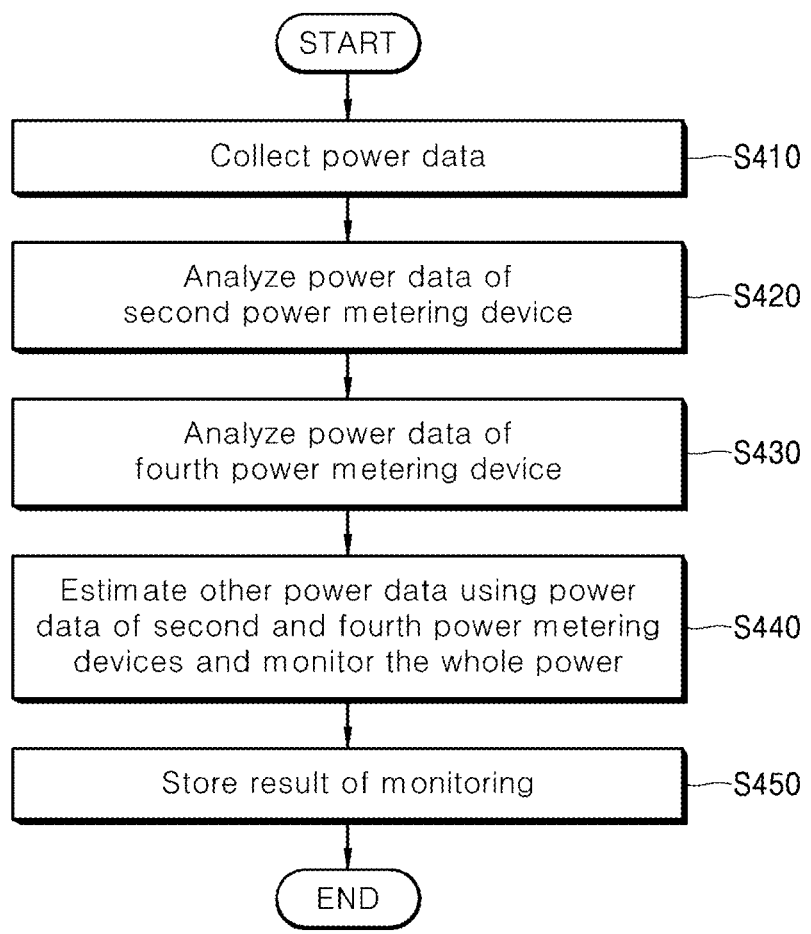

FIG. 4 is a flowchart illustrating a method for monitoring power in the monitoring server 10 using second power data detected by the second power metering device and fourth power data detected by the fourth power metering device when the ESS operates in a DC charge mode.

In the DC charge mode, the ESS 140 is not supplied with any power from the external power supply source 110. Nor does the ESS 140 discharge power to the distribution board 120. Accordingly, the second power data is identical to the first power data, and thus the method for monitoring the power of the whole system using the first and fourth power data described above with reference to FIG. 3 may be applied to the method for monitoring power of the whole system using the second and fourth power data in FIG. 4.

Hereinafter, a method for monitoring power in a monitoring server when the ESS 140 operates in an alternating current (AC) charge mode will be described with reference to FIGS. 5 to 7.

Figure 5:
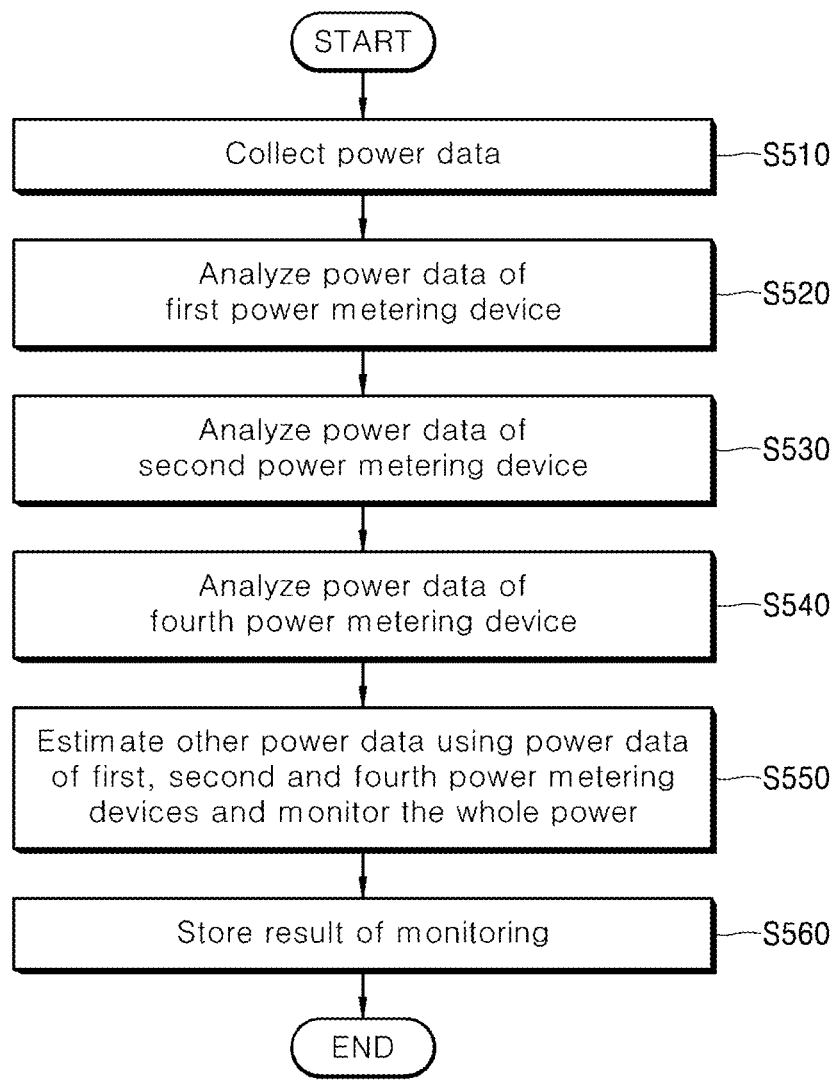
FIGS. 5 to 7 are flowcharts illustrating a method for monitoring power when an energy storage system operates in an AC charge mode according to some embodiments of the present disclosure.

FIG. 5 is a flowchart illustrating a method for monitoring power in the monitoring server 10 using first power data detected by the first power metering device, second power data detected by the second power metering device and fourth power data detected by the fourth power metering device when the ESS operates in an AC charge mode.

Herein, the AC charge mode may be a mode in which the ESS 140 stores AC power applied from the external power supply source 110 as well as DC power applied from the renewable energy source 150.

Referring to FIG. 5, the monitoring server 10 may collect power data via the communication unit 11 (S510). Specifically, the monitoring server 10 may receive power data from the first power metering device 171 provided to the output of the external power supply source 110, the second power metering device 172 provided to the input of the distribution board 120, and the fourth power metering device 174 provided to the output of the renewable energy source 150.

In FIG. 2, the third power metering device 173 is illustrated as being provided to the input of the ESS 140. Since the third power data of the third power metering device 173 can be estimated based on the first power data, second power data and fourth power data, power may be monitored without using the third power data in some embodiments.

The controller 12 of the monitoring server 10 may analyze the first power data of the first power metering device 171 collected via the communication unit 11 (S520).

In this case, the first power data may contain information about the amount of power applied from the external power supply source 110. In other words, the first power data may contain information about the total amount of power consumed by the ESS 140 and a plurality of electronic devices 130.

The controller 12 of the monitoring server 10 may analyze the second power data of the second power metering device 172 collected via the communication unit 11 (S530).

The second power data may contain the total amount of power consumption of the plurality of electronic devices 130 and a total power consumption pattern. Further, the second power data may contain power consumption patterns of the individual electronic devices constituting the plurality of electronic devices 130.

The controller 12 of the monitoring server 10 may analyze the fourth power data of the fourth power metering device 174 collected via the communication unit 11 (S540).

In this case, the fourth power data of the fourth power metering device 174 may contain the amount of power generated and applied to the ESS 140 by the renewable energy source 150, namely the amount of the DC power generated by the renewable energy source 150 and stored in the ESS 140.

The controller 12 of the monitoring server 10 may estimate the third power data based on the first power data detected by the first power metering device 171, the second power data detected by the second power metering device 172 and the fourth power data detected by the fourth power metering device 174, and monitor the power of the system (S550).

Specifically, the controller 12 may acquire the amount of power applied from the external power supply source 110 using the first power data detected by the first power metering device 171. The controller 12 may also acquire at least one of the total amount of power consumption of the plurality of electronic devices 130, the amount of power consumption of each individual electronic device constituting the plurality of electronic devices 130 and operational status information about the individual electronic devices, using the second power data detected by the second power metering device 172. The controller 12 may also acquire the amount of power applied from the renewable energy source 150 to the ESS 140, using the fourth power data of the fourth power metering device 174. Thereby, the controller 12 may acquire the amount of DC charge of the ESS 140. In this case, the NILM algorithm may be used.

Further, the controller 12 may acquire the amount of AC charge of the ESS by estimating the third power data using the first power data and second power data. Specifically, the controller 12 may acquire the amount of AC charge of the ESS 140 by subtracting the total amount of power consumption of the plurality of electronic devices 130 contained in the second power data from the amount of power applied from the external power supply source 110 contained in the first power data.

The controller 12 may store the result of monitoring and the operational status information about the ESS 140 in the storage unit 13 (S560).

Figure 6:
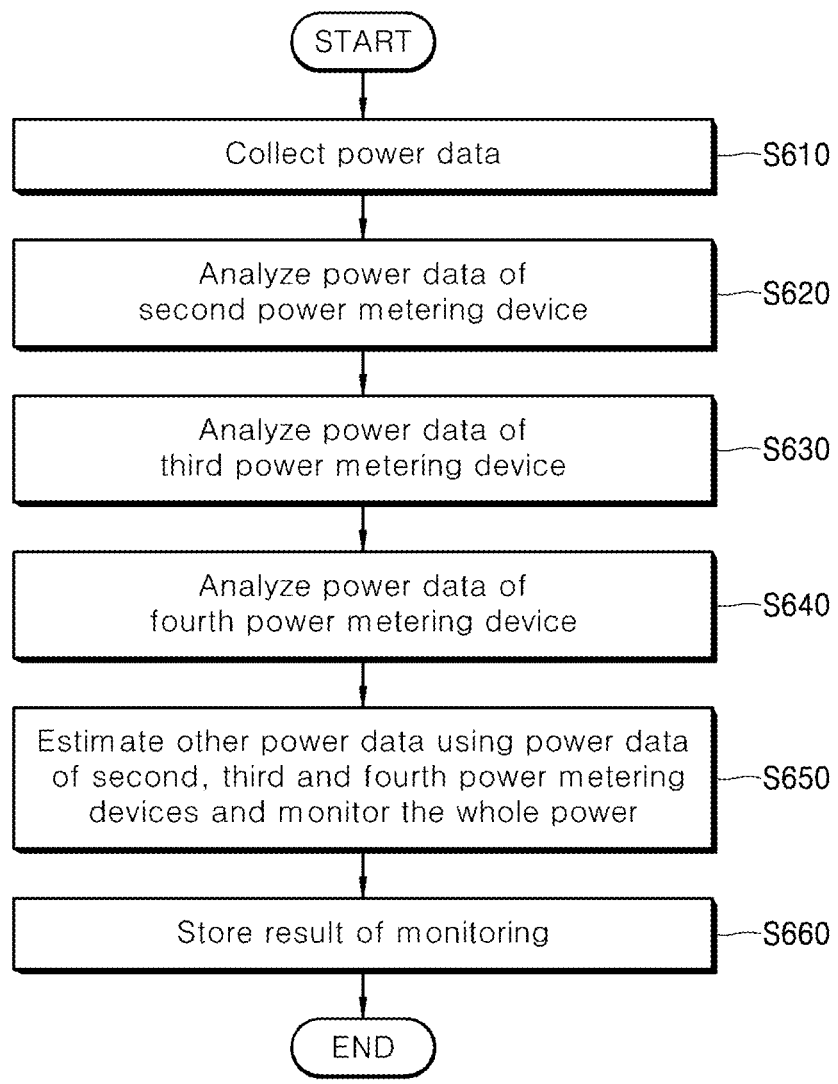

FIG. 6 is a flowchart illustrating a method for monitoring power in the monitoring server 10 using second power data detected by the second power metering device, third power data detected by the third power metering device, and fourth power data detected by the fourth power metering device when the ESS operates in the AC charge mode.

Referring to FIG. 6, the monitoring server 10 may collect power data via the communication unit 11 (S610). Specifically, the monitoring server 10 may receive power data from the second power metering device 172 provided to the input of the distribution board 120, the third power metering device 173 provided to the input end of the ESS 140 and the fourth power metering device 174 provided to the output of the renewable energy source 150.

In FIG. 2, the first power metering device 171 is illustrated as being provided to the output of the external power supply source 110. Since the first power data of the first power metering device 171 can be estimated based on the second power data, third power data and fourth power data, power may be monitored without using the first power data in some embodiments.

The controller 12 of the monitoring server 10 may analyze the second power data of the second power metering device 172 collected via the communication unit 11 (S620).

In this case, the second power data may contain the total amount of power consumption of the plurality of electronic devices 130 and a total power consumption pattern. Further, the second power data may contain power consumption patterns of the individual electronic devices constituting the plurality of electronic devices 130.

The controller 12 of the monitoring server 10 may analyze the third power data of the third power metering device 173 collected via the communication unit 11 (S630).

In this case, the third power data may contain information about the amount of AC power supplied from the external power supply source 110 and applied to the ESS 140.

The controller 12 of the monitoring server 10 may analyze the fourth power data of the fourth power metering device 174 collected via the communication unit 11 (S640).

In this case, the fourth power data of the fourth power metering device 174 may contain the amount of power generated and applied to the ESS 140 by the renewable energy source 150, namely the amount of the DC power generated by the renewable energy source 150 and stored in the ESS 140.

The controller 12 of the monitoring server 10 may estimate the first power data based on the second power data detected by the second power metering device 172, the third power data detected by the third power metering device 173 and the fourth power data detected by the fourth power metering device 174, and monitor the power of the system (S650).

Specifically, the controller 12 may acquire at least one of the total amount of power consumption of the plurality of electronic devices 130, the amount of power consumption of each individual electronic device constituting the plurality of electronic devices 130 and the operational status information about the individual electronic devices, using the second power data detected by the second power metering device 172. The controller 12 may also acquire the amount of AC power supplied from the external power supply source 110 and applied to the ESS 140 to be stored in the ESS 140, using the third power data detected by the third power metering device 173. The controller 12 may also acquire the amount of power applied from the renewable energy source 150 to the ESS 140, using the fourth power data of the fourth power metering device 174. Thereby, the controller 12 may acquire the amount of DC charge of the ESS 140. In this case, the NILM algorithm may be used.

Further, the controller 12 may acquire the amount of power applied from the external power supply source 110 by estimating the first power data using the second power data and third power data. Specifically, the controller 12 may acquire the amount of power applied from the external power supply source 110 by adding the total amount of power consumption of the plurality of electronic devices 130 contained in the second power data to the amount of AC power stored in the ESS 140 contained in the third power data.

The controller 12 may store the result of monitoring and the operational status information about the ESS 140 in the storage unit 13 (S660).

Figure 7:
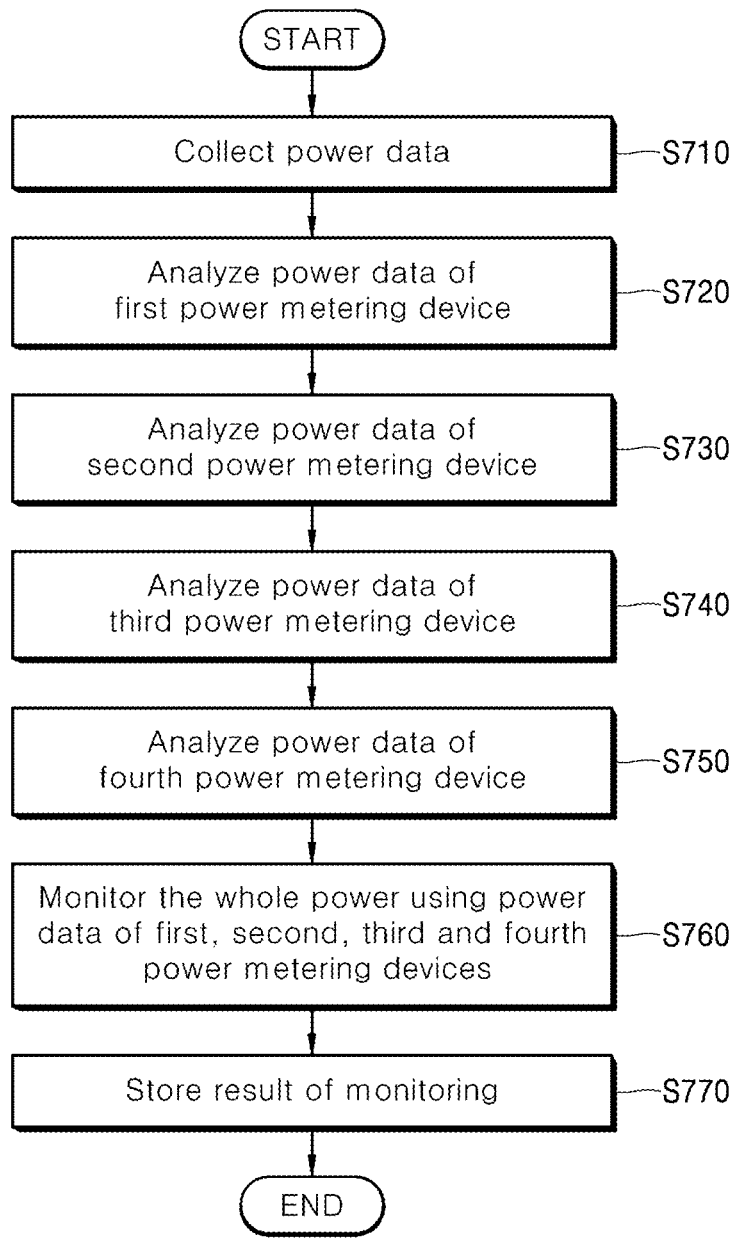

FIG. 7 is a flowchart illustrating a method for monitoring power in the monitoring server 10 using first power data detected by the first power metering device, second power data detected by the second power metering device, third power data detected by the third power metering device, and fourth power data detected by the fourth power metering device when the ESS operates in the AC charge mode.

Referring to FIG. 7, the monitoring server 10 may collect power data via the communication unit 11 (S710). Specifically, the monitoring server 10 may receive power data from the first power metering device 171 provided to the output of the external power supply source 110, the second power metering device 172 provided to the input of the distribution board 120, the third power metering device 173 provided to the input end of the ESS 140 and the fourth power metering device 174 provided to the output of the renewable energy source 150.

The controller 12 of the monitoring server 10 may analyze the first power data of the first power metering device 171 collected via the communication unit 11 (S720).

In this case, the first power data may contain information about the amount of power applied from the external power supply source 110. In other words, the first power data may contain information about the total amount of power consumed by the ESS 140 and a plurality of electronic devices 130.

The controller 12 of the monitoring server 10 may analyze the second power data of the second power metering device 172 collected via the communication unit 11 (S730).

In this case, the second power data may contain the total amount of power consumption of the plurality of electronic devices 130 and a total power consumption pattern. Further, the second power data may contain power consumption patterns of the individual electronic devices constituting the plurality of electronic devices 130.

The controller 12 of the monitoring server 10 may analyze the third power data of the third power metering device 173 collected via the communication unit 11 (S740).

In this case, the third power data may contain information about the amount of AC power supplied from the external power supply source 110 and applied to the ESS 140.

The controller 12 of the monitoring server 10 may analyze the fourth power data of the fourth power metering device 174 collected via the communication unit 11 (S750).

In this case, the fourth power data of the fourth power metering device 174 may contain the amount of power generated and applied to the ESS 140 by the renewable energy source 150, namely the amount of the DC power generated by the renewable energy source 150 and stored in the ESS 140.

The controller 12 of the monitoring server 10 may monitor the power of the system based on the first power data detected by the first power metering device 171, the second power data detected by the second power metering device 172, the third power data detected by the third power metering device 173 and the fourth power data detected by the fourth power metering device 174 (S760).

Specifically, the controller 12 may acquire the amount of power applied from the external power supply source 110 using the first power data detected by the first power metering device 171. The controller 12 may also acquire at least one of the total amount of power consumption of the plurality of electronic devices 130, the amount of power consumption of each individual electronic device constituting the plurality of electronic devices 130 and the operational status information about the individual electronic devices, using the second power data detected by the second power metering device 172. The controller 12 may also acquire the amount of AC power supplied from the external power supply source 110 and applied to the ESS 140 to be stored in the ESS 140, using the third power data detected by the third power metering device 173. The controller 12 may also acquire the amount of power applied from the renewable energy source 150 to the ESS 140, using the fourth power data of the fourth power metering device 174. Thereby, the controller 12 may acquire the amount of DC charge of the ESS 140. In this case, the NILM algorithm may be used.

The controller 12 may store the result of monitoring and the operational status information about the ESS 140 in the storage unit 13 (S770).

Hereinafter, a description will be given of a method for monitoring power in a monitoring server when the ESS 140 operates in a discharge mode (as a power generation source), with reference to FIGS. 8 to 10.

Figure 8:
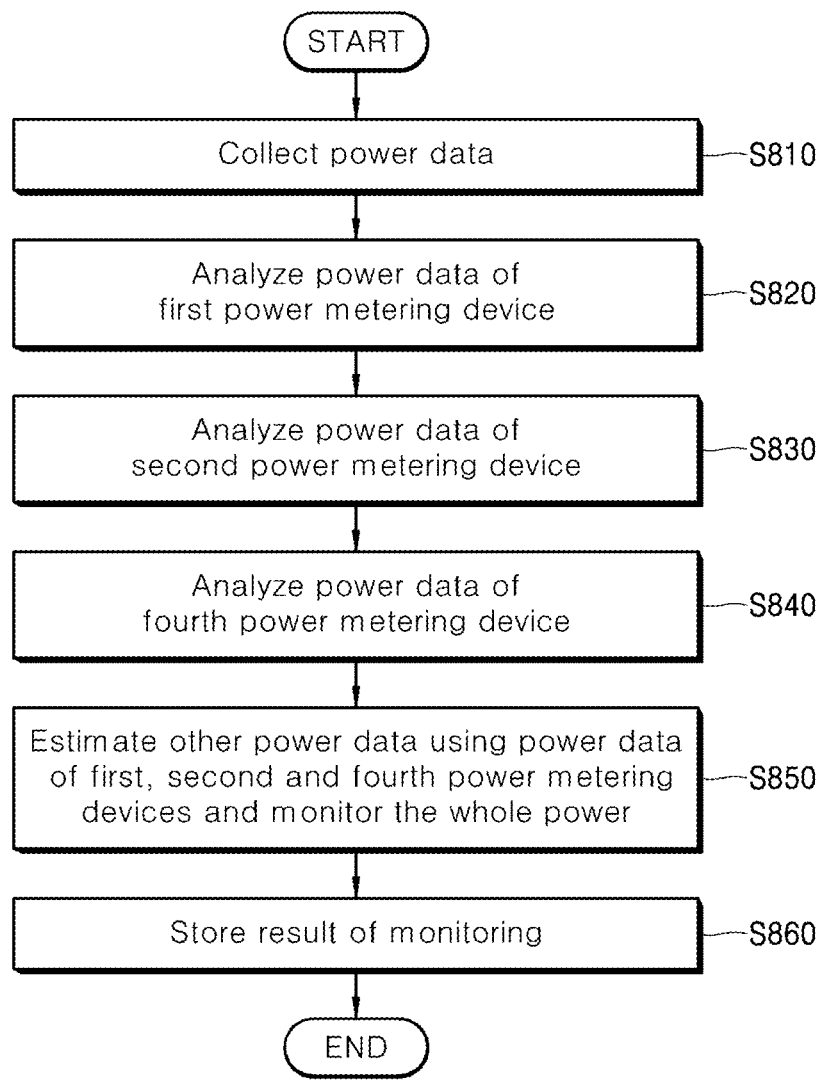
FIGS. 8 to 10 are flowcharts illustrating a method for monitoring power when an energy storage system operates in a discharge mode according to some embodiments of the present disclosure.

FIG. 8 is a flowchart illustrating a method for monitoring power in the monitoring server 10 using first power data detected by the first power metering device, second power data detected by the second power metering device and fourth power data detected by the fourth power metering device when the ESS operates in a discharge mode (as a power generation source).

Referring to FIG. 8, the monitoring server 10 may collect power data via the communication unit 11 (S810). Specifically, the monitoring server 10 may receive power data from the first power metering device 171 provided to the output of the external power supply source 110, the second power metering device 172 provided to the input of the distribution board 120, and the fourth power metering device 174 provided to the output of the renewable energy source 150.

In FIG. 2, the third power metering device 173 is illustrated as being provided to the input of the ESS 140. However, since the third power data of the third power metering device 173 can be estimated based on the first power data, second power data and fourth power data, power may be monitored without using the third power data in some embodiments.

The controller 12 of the monitoring server 10 may analyze the first power data of the first power metering device 171 collected via the communication unit 11 (S820).

In this case, the first power data may contain information about the amount of power applied from the external power supply source 110.

The controller 12 of the monitoring server 10 may analyze the second power data of the second power metering device 172 collected via the communication unit 11 (S830).

The second power data may contain the total amount of power consumption of the plurality of electronic devices 130 and a total power consumption pattern. Further, the second power data may contain power consumption patterns of the individual electronic devices constituting the plurality of electronic devices 130.

The controller 12 of the monitoring server 10 may analyze the fourth power data of the fourth power metering device 174 collected via the communication unit 11 (S840).

In this case, the fourth power data of the fourth power metering device 174 may contain the amount of power generated and applied to the ESS 140 by the renewable energy source 150, namely the amount of the DC power generated by the renewable energy source 150 and stored in the ESS 140.

The controller 12 of the monitoring server 10 may estimate the third power data based on the first power data detected by the first power metering device 171, the second power data detected by the second power metering device 172 and the fourth power data detected by the fourth power metering device 174, and monitor the power of the system (S850).

Specifically, the controller 12 may acquire the amount of power applied from the external power supply source 110 using the first power data detected by the first power metering device 171. The controller 12 may also acquire at least one of the total amount of power consumption of the plurality of electronic devices 130, the amount of power consumption of each individual electronic device constituting the plurality of electronic devices 130 and the operational status information about the individual electronic devices, using the second power data detected by the second power metering device 172. The controller 12 may also acquire the amount of power applied from the renewable energy source 150 to the ESS 140, using the fourth power data of the fourth power metering device 174. Thereby, the controller 12 may acquire the amount of DC charge of the ESS 140. In this case, the NILM algorithm may be used.

Further, the controller 12 may acquire the amount of AC discharge of the ESS by estimating the third power data using the first power data and second power data. Specifically, the controller 12 may acquire the amount of AC discharge of the ESS 140 by subtracting the amount of power applied from the external power supply source 110 contained in the first power data from the total amount of power consumption of the plurality of electronic devices 130 contained in the second power data.

The controller 12 may store the result of monitoring and the operational status information about the ESS 140 in the storage unit 13 (S860).

Figure 9:
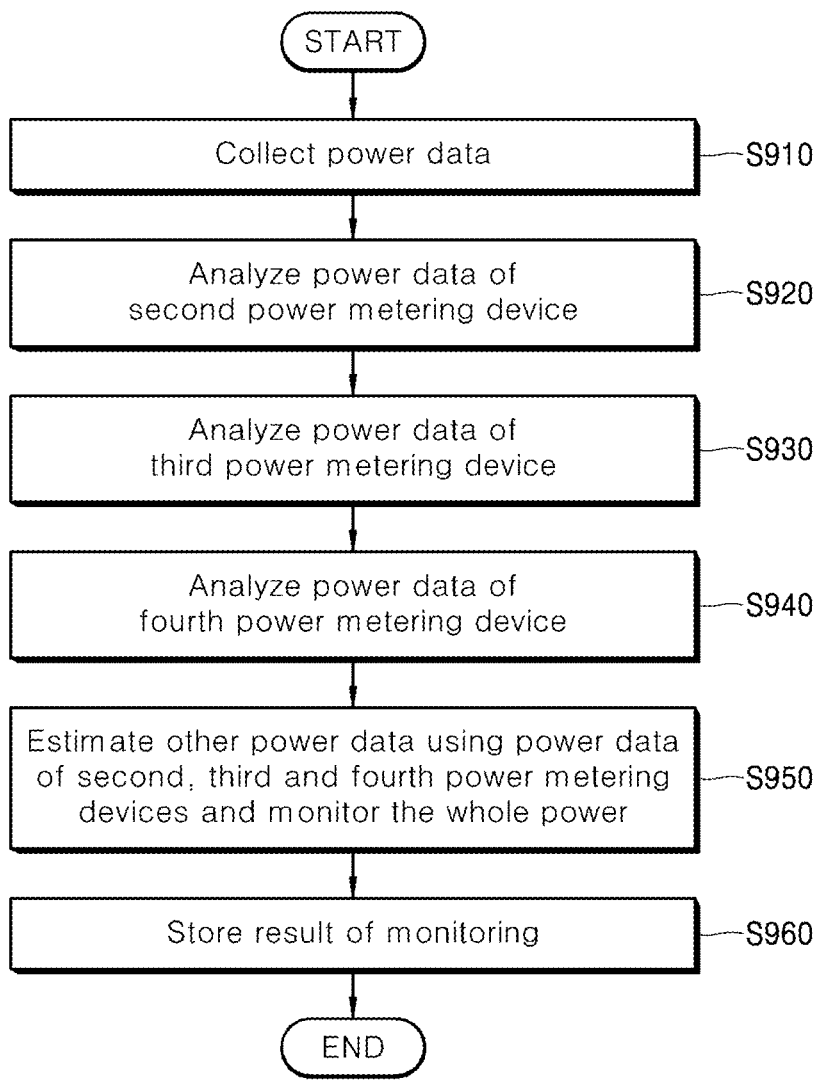

FIG. 9 is a flowchart illustrating a method for monitoring power in the monitoring server 10 using second power data detected by the second power metering device, third power data detected by the third power metering device, and fourth power data detected by the fourth power metering device when the ESS operates in a discharge mode (as a power generation source).

Referring to FIG. 9, the monitoring server 10 may collect power data via the communication unit 11 (S910) Specifically, the monitoring server 10 may receive power data from the second power metering device 172 provided to the input of the distribution board 120, the third power metering device 173 provided to the input end of the ESS 140 and the fourth power metering device 174 provided to the output of the renewable energy source 150.

In FIG. 9, the first power metering device 171 is illustrated as being provided to the output of the external power supply source 110. However, since the first power data of the first power metering device 171 can be estimated based on the second power data, third power data and fourth power data, power may be monitored without using the first power data in some embodiments.

The controller 12 of the monitoring server 10 may analyze the second power data of the second power metering device 172 collected via the communication unit 11 (S920).

In this case, the second power data may contain the total amount of power consumption of the plurality of electronic devices 130 and a total power consumption pattern. Further, the second power data may contain power consumption patterns of the individual electronic devices constituting the plurality of electronic devices 130.

The controller 12 of the monitoring server 10 may analyze the third power data of the third power metering device 173 collected via the communication unit 11 (S930).

In this case, the third power data may contain information about the amount of AC power supplied from the external power supply source 110 and applied to the ESS 140. In other words, the third power data may contain information about the amount of AC power discharged from the ESS 140 and applied to the distribution board 120.

The controller 12 of the monitoring server 10 may analyze the fourth power data of the fourth power metering device 174 collected via the communication unit 11 (S940).

In this case, the fourth power data of the fourth power metering device 174 may contain the amount of power generated and applied to the ESS 140 by the renewable energy source 150, namely the amount of the DC power generated by the renewable energy source 150 and stored in the ESS 140.

The controller 12 of the monitoring server 10 may estimate the first power data based on the second power data detected by the second power metering device 172, the third power data detected by the third power metering device 173 and the fourth power data detected by the fourth power metering device 174, and monitor the power of the system (S950).

Specifically, the controller 12 may acquire at least one of the total amount of power consumption of the plurality of electronic devices 130, the amount of power consumption of each individual electronic device constituting the plurality of electronic devices 130 and the operational status information about the individual electronic devices, using the second power data detected by the second power metering device 172. The controller 12 may also acquire the amount of AC power discharged from the ESS 140 and applied to the distribution board 120 to be supplied to the electronic devices 130, using the third power data detected by the third power metering device 173. The controller 12 may also acquire the amount of power applied from the renewable energy source 150 to the ESS 140, using the fourth power data of the fourth power metering device 174. Thereby, the controller 12 may acquire the amount of DC charge of the ESS 140. In this case, the NILM algorithm may be used.

Further, the controller 12 may acquire the amount of power applied from the external power supply source 110 by estimating the first power data using the second power data and third power data. Specifically, the controller 12 may acquire the amount of power applied from the external power supply source 110 by subtracting the amount of AC power discharged from the ESS 140 from the total amount of power consumption of the plurality of electronic devices 130 contained in the second power data.

The controller 12 may store the result of monitoring and the operational status information about the ESS 140 in the storage unit 13 (S960).

Figure 10:
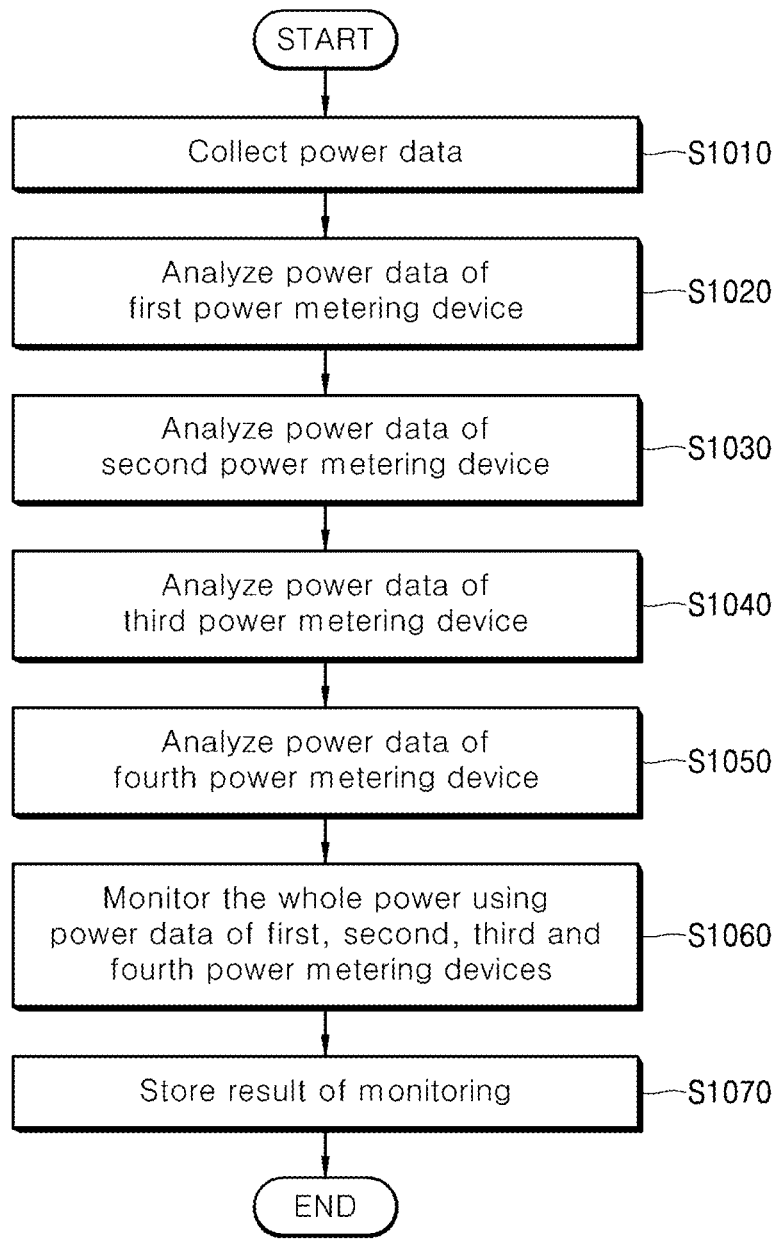

FIG. 10 is a flowchart illustrating a method for monitoring power in the monitoring server 10 using first power data detected by the first power metering device, second power data detected by the second power metering device, third power data detected by the third power metering device, and fourth power data detected by the fourth power metering device when the ESS operates in a discharge mode (as a power generation source).

Referring to FIG. 10, the monitoring server 10 may collect power data via the communication unit 11 (S1010). Specifically, the monitoring server 10 may receive power data from the first power metering device 171 provided to the output of the external power supply source 110, the second power metering device 172 provided to the input of the distribution board 120, the third power metering device 173 provided to the input end of the ESS 140 and the fourth power metering device 174 provided to the output of the renewable energy source 150.

The controller 12 of the monitoring server 10 may analyze the first power data of the first power metering device 171 collected via the communication unit 11 (S1020).

In this case, the first power data may contain information about the amount of power applied from the external power supply source 110.

The controller 12 of the monitoring server 10 may analyze the second power data of the second power metering device 172 collected via the communication unit 11 (S1030).

In this case, the second power data may contain the total amount of power consumption of the plurality of electronic devices 130 and a total power consumption pattern. Further, the second power data may contain power consumption patterns of the individual electronic devices constituting the plurality of electronic devices 130.

The controller 12 of the monitoring server 10 may analyze the third power data of the third power metering device 173 collected via the communication unit 11 (S1040).

In this case, the third power data may contain information about the amount of AC power supplied from the external power supply source 110 and applied to the ESS 140. In other words, the third power data may contain information about the amount of AC power discharged from the ESS 140 and applied to the distribution board 120.

The controller 12 of the monitoring server 10 may analyze the fourth power data of the fourth power metering device 174 collected via the communication unit 11 (S1050).

In this case, the fourth power data of the fourth power metering device 174 may contain the amount of power generated and applied to the ESS 140 by the renewable energy source 150, namely the amount of the DC power generated by the renewable energy source 150 and stored in the ESS 140.

The controller 12 of the monitoring server 10 may monitor the power of the system based on the first power data detected by the first power metering device 171, the second power data detected by the second power metering device 172, the third power data detected by the third power metering device 173 and the fourth power data detected by the fourth power metering device 174 (S1060).

Specifically, the controller 12 may acquire the amount of power applied from the external power supply source 110 using the first power data detected by the first power metering device 171. The controller 12 may also acquire at least one of the total amount of power consumption of the plurality of electronic devices 130, the amount of power consumption of each individual electronic device constituting the plurality of electronic devices 130 and the operational status information about the individual electronic devices, using the second power data detected by the second power metering device 172. The controller 12 may also acquire the amount of AC power discharged from the ESS 140 and applied to the distribution board 120 to be supplied to the electronic devices 130, using the third power data detected by the third power metering device 173. The controller 12 may also acquire the amount of power applied from the renewable energy source 150 to the ESS 140, using the fourth power data of the fourth power metering device 174. Thereby, the controller 12 may acquire the amount of DC charge of the ESS 140. In this case, the NILM algorithm may be used.

The controller 12 may store the result of monitoring and the operational status information about the ESS 140 in the storage unit 13 (S1070).

Since some embodiments in the present disclosure can obtain the amount of power supplied from the external power supply source 110, the amount of charge of the ESS 140, the amount of discharge of the ESS 140, the amount of discharge of the renewable energy source 150, the total amount of power consumption of the plurality of electronic devices 130, the amount of power consumed by each individual electronic device, and operational status information about the individual electronic devices using the first power metering device 171, the second power metering device 172, the third power metering device 173 and the fourth power metering device 174 as described above, it is possible to comprehensively monitor power production and consumption.

Further, with some embodiments in the present disclosure, it is possible to estimate the amount of power supplied from the external power supply source 110 and the amount of power used in the ESS 140 even if one or more of the first power metering device 171, the second power metering device 172 and the third power metering device 173 are not provided. Accordingly, it is possible to comprehensively monitor power production and consumption irrespective of malfunction or maintenance of any of the plurality of power metering devices.

Further, as the first power metering device 171, the second power metering device 172, the third power metering device 173 and the fourth power metering device 174 are all used, the power in the system may be monitored with a minimized error.

Figure 11:
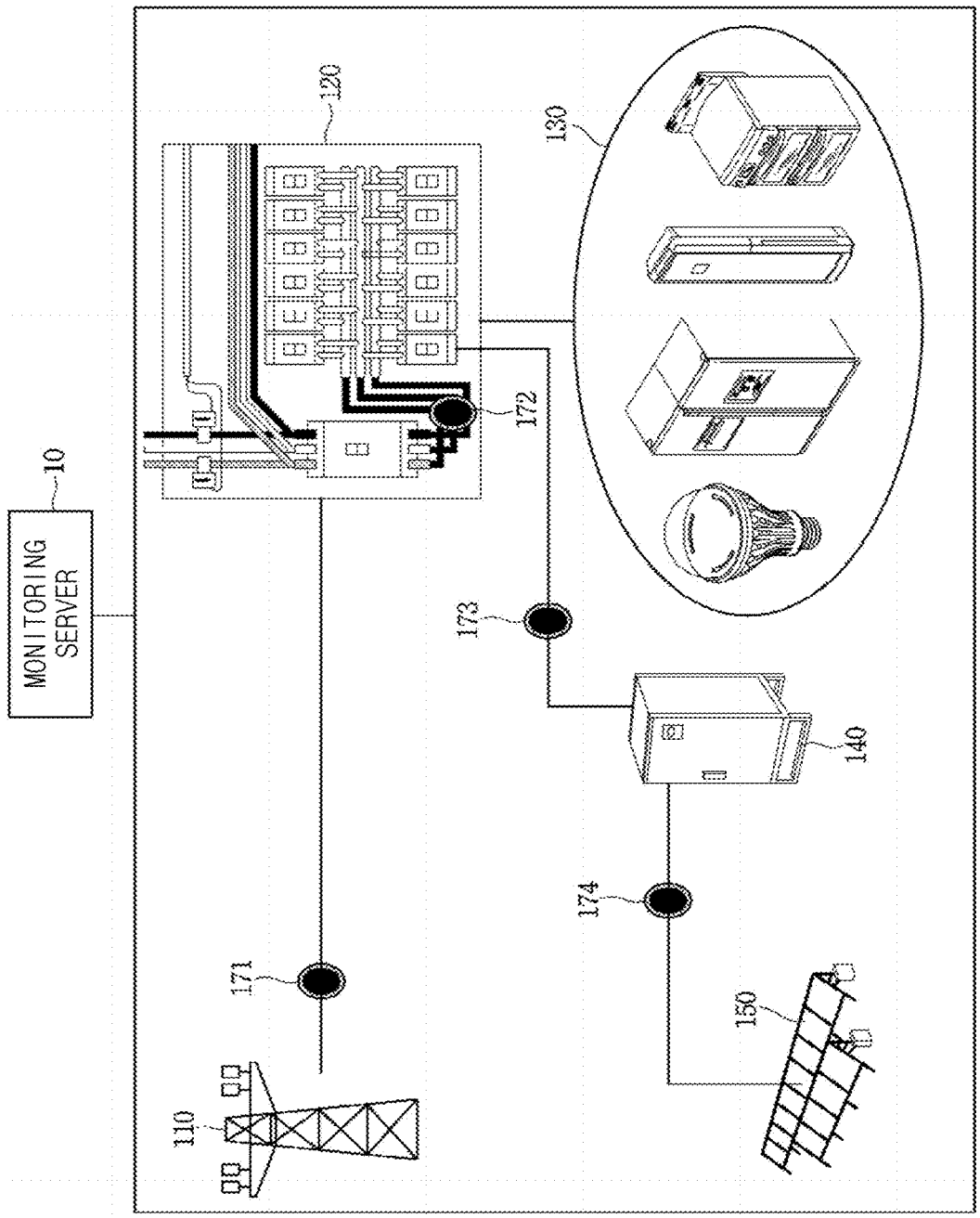
FIG. 11 is a block diagram illustrating a system for monitoring power consumed by loads according to some embodiments of the present disclosure.

FIG. 11 is a block diagram illustrating a system for monitoring power consumed by loads according to some embodiments of the present disclosure.

Referring to FIG. 11, the system for monitoring power consumed by loads according to some embodiments of the present disclosure includes a monitoring server 10, an external power supply source 110, a distribution board 120, electronic devices 130 and an ESS 140 and a renewable energy source 150. In particular, the outputs or inputs of the external power supply source 110, the distribution board 120, the ESS 140 and the renewable energy source 150 may include power metering devices 171, 172, 173 and 174 respectively to detect power data input to or output from the aforementioned components.

The monitoring server 10 may obtain power data containing the amounts of power consumption, applied power or power consumption patterns of loads and power sources measured by the power metering devices 171, 172, 173 and 174. In addition, the monitoring server 10 may monitor and output, based on the obtained data, the power supplied to the whole system, power consumption of the whole system, and power consumption and operational statuses of individual loads in the system.

The power from the external power supply source 110, which is an external power generation source such as a power plant, may be supplied to various loads including the electronic devices 130 in a household through the distribution board 120. The power from the external power supply source 110 may also be applied to the ESS 140 via the distribution board 120 and used to charge the ESS 140.

The distribution board 120 may distribute power applied thereto such that the power is applied to at least one of the electronic devices 130 and the ESS 140 in a household.

The ESS 140 may be connected to the output of the distribution board 120 to store the power distributed from the distribution board 120 and allow the stored power to be applied to the electronic device 130 via the distribution board 120 at a specific time (or when a user requests power application). For example, power may be stored in the ESS 140 during hours when power consumption is low or the electricity rate is low, for example, during late-night hours. Then, the stored power may be discharged to the electronic devices 130 connected to one end of the distribution board 120 during hours when demand for electricity surges or the electricity rate is high.

A photovoltaic power generation system may be configured as the renewable energy source 150. The photovoltaic power generation system may convert incident solar light into power and apply the power to the ESS 140.

The power metering devices 171, 172, 173 and 174 may be connected to the output of the external power supply source 110, the input of the distribution board 120, the input of the ESS 140 and the output of the renewable energy source 150, respectively.

A first power metering device 171 connected to the output of the external power supply source 110 may include at least one module capable of measuring the power supplied from the external power supply source 110.

Further, the first power metering device 171 may include at least one module capable of measuring the total amount of power consumption of the loads and the ESS 140 and an overall power consumption pattern when the power from the external power supply source 110 is supplied to a plurality of loads such as the electronic devices 130 and the ESS 140.

Further, the first power metering device 171 may measure power consumption patterns of the respective loads and a power consumption pattern of the ESS 140. These power consumption patterns may be analyzed using the NILM algorithm. Thereby, the power consumption patterns may be used to acquire at least one of the amount of power consumed by each of the loads, operational status information about each of the loads, the amount of power consumed by the ESS 140 and operational status information about the ESS 140.

A second power metering device 172 connected to the input of the distribution board 120 may include at least one module capable of measuring the total amount of power consumption of a plurality of loads such as the electronic devices 130 and the ESS 140 and a consumption pattern of the whole power when power from the external power supply source 110 is distributed to the loads and the ESS 140.

The second power metering device 172 may also measure power consumption patterns of the respective loads or the power consumption pattern of the ESS 140. Thereafter, the power consumption patterns of the loads may be analyzed using the NILM algorithm. Thereby, the power consumption patterns may be used to acquire at least one of the amount of power consumed by each of the loads, operational status information about each of the loads, the amount of power consumed by the ESS 140 and operational status information about the ESS 140.

A third power metering device 173 connected to the input of the ESS 140 may include at least one module capable of measuring the amount of power stored in the ESS 140 or the amount of power discharged from the ESS 140.

The third power metering device 173 may also include at least one module capable of measuring a power consumption pattern of the ESS 140. The power consumption pattern of the ESS 140 may be analyzed using the the NILM algorithm. Thereby, the power consumption pattern of the ESS 140 may be used to acquire at least one of the amount of power stored in or discharged from the ESS 140 and operational status information about the ESS 140.

A fourth power metering device 174 connected to the output of the renewable energy source 150 includes at least one module capable of measuring power data about power generated by the renewable energy source 150. Specifically, the fourth power metering device 174 may be installed at a point at which the renewable energy source 150 and the ESS 140 are connected. Thereby, the fourth power metering device 174 may check the power data applied from the renewable energy source 150 to the ESS 140.

Hereinafter, a detailed description will be given of a method for monitoring power consumed by loads based on the configuration of the power monitoring system including the power metering devices described above according to some embodiments of the present disclosure, with reference to FIGS. 12 to 19. Although the method for monitoring power described below is limited to a sequence of collecting data, it should be noted that the data may be collected from the respective power metering devices, irrespective of the sequence of collecting data.

FIGS. 12 to 19 are flowcharts illustrating methods for monitoring power in a power monitoring system according to some embodiments of the present disclosure.

Figure 12:
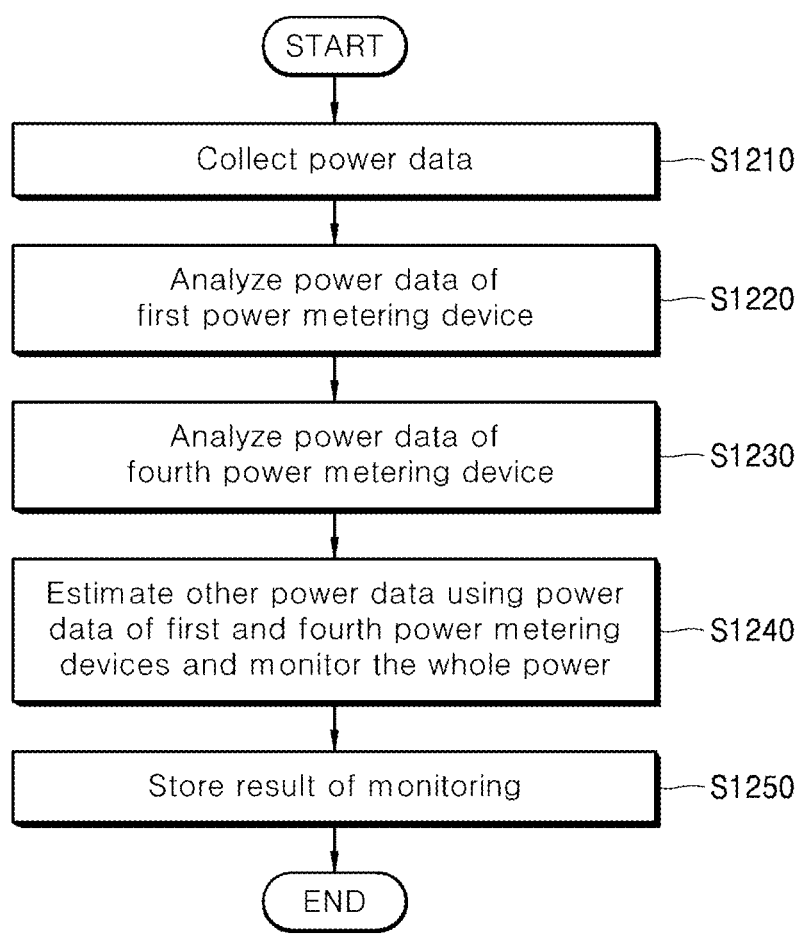
FIGS. 12 and 13 are flowcharts illustrating a method for monitoring power when an energy storage system operates in a DC charge mode according to some embodiments of the present disclosure.

FIG. 12 is a flowchart illustrating a method for monitoring power in the monitoring server 10 using first power data detected by the first power metering device and fourth power data detected by the fourth power metering device when the ESS operates in a DC charge mode.

Referring to FIG. 12, the monitoring server 10 may collect power data via the communication unit 11 (S1210). Specifically, the monitoring server 10 may receive first power data from the first power metering device 171 provided to the output of the external power supply source 110. In addition, the monitoring server 10 may receive fourth power data from the fourth power metering device 174 provided to the output of the renewable energy source 150.

In FIG. 11, the second power metering device 172 is illustrated as being provided to the input of the distribution board 120 and the third power metering device 173 is provided to the input of the ESS 140. Since the second power data of the second power metering device 172 and the third power data of the third power metering device 173 can be estimated based on the first power data and fourth power data, power may be monitored without using the second and third power data in some embodiments.

The controller 12 of the monitoring server 10 may analyze the first power data of the first power metering device 171 collected via the communication unit 11 (S1220).

In this case, the first power data may contain information about the amount of power applied from the external power supply source 110.

The first power data may also contain the total amount of power consumption of the plurality of electronic devices 130 and the ESS 140 and a total power consumption pattern.

Further, the first power data may contain power consumption patterns of the individual electronic devices constituting the plurality of electronic devices 130 and a power consumption pattern of the ESS 140.

The controller 12 of the monitoring server 10 may analyze the fourth power data of the fourth power metering device 174 collected via the communication unit 11 (S1230).

In this case, the fourth power data of the fourth power metering device 174 may contain the amount of power generated and applied to the ESS 140 by the renewable energy source 150, namely the DC power generated by the renewable energy source 150 and stored in the ESS 140.

The controller 12 of the monitoring server 10 may estimate the second power data and third power data based on the first power data detected by the first power metering device 171 and the fourth power data detected by the fourth power metering device 174, and monitor the power of the system (S1240).

Specifically, the controller 12 may acquire the amount of power applied from the external power supply source 110 using the first power data detected by the first power metering device 171. The controller 12 may also acquire at least one of the amount of power consumption of each individual electronic device constituting the plurality of electronic devices 130 and the operational status information about the individual electronic devices, using the first power data detected by the first power metering device 171. The controller 12 may also acquire the amount of power charge applied from the renewable energy source 150 and stored in the ESS 140, using the fourth power data detected by the fourth power metering device 174. In this case, the NILM algorithm may be used.

The controller 12 of the monitoring server 10 may estimate at least one of the second power data and third power data using the first power data detected by the first power metering device 171 and the fourth power data detected by the fourth power metering device 174. Specifically, when the ESS 140 is in the DC charge mode, the ESS 140 is not supplied with power distributed from the distribution board 120. Nor does the ESS 140 discharge power to the electronic devices 130 via the distribution board 120. Accordingly, the controller 12 may estimate that the second power data is identical to the first power data and that there is no applied power for the third power data.

The monitoring server 10 may monitor the power of the whole system using other power data estimated using the first power data, the fourth power data and first power data, or the fourth power data.

The controller 12 may store the result of monitoring in the storage unit 13 (S1250).

Figure 13:
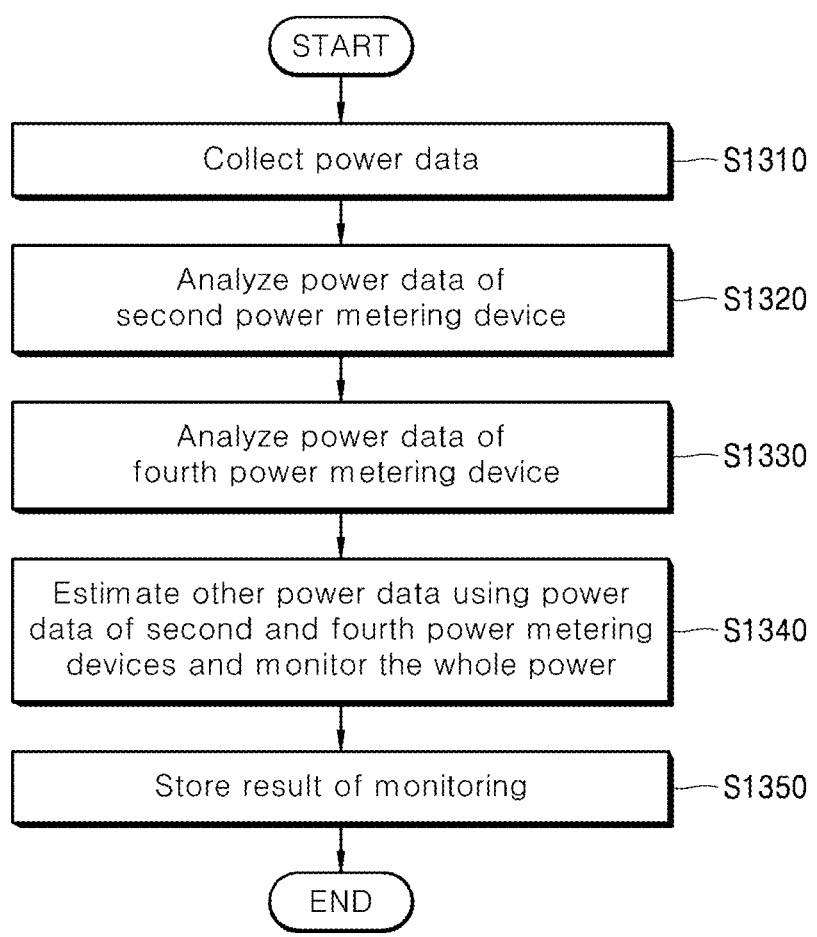

FIG. 13 is a flowchart illustrating a method for monitoring power in the monitoring server 10 using second power data detected by the second power metering device and fourth power data detected by the fourth power metering device when the ESS 140 operates in a DC charge mode.

In the DC charge mode, the ESS 140 is not supplied with power distributed from the distribution board 120. Nor does the ESS 140 discharge power to the electronic devices 130 via the distribution board 120. Accordingly, in the DC charge mode, the second power data is identical to the first power data, and thus the method for monitoring the power of the whole system using the first and fourth power data described above with reference to FIG. 12 may be applied to the method for monitoring power of the whole system using the second and fourth power data in FIG. 13.

Hereinafter, a method for monitoring power in a monitoring server when the ESS 140 operates in an alternating current (AC) charge mode will be described with reference to FIGS. 14 to 16.

Figure 14:
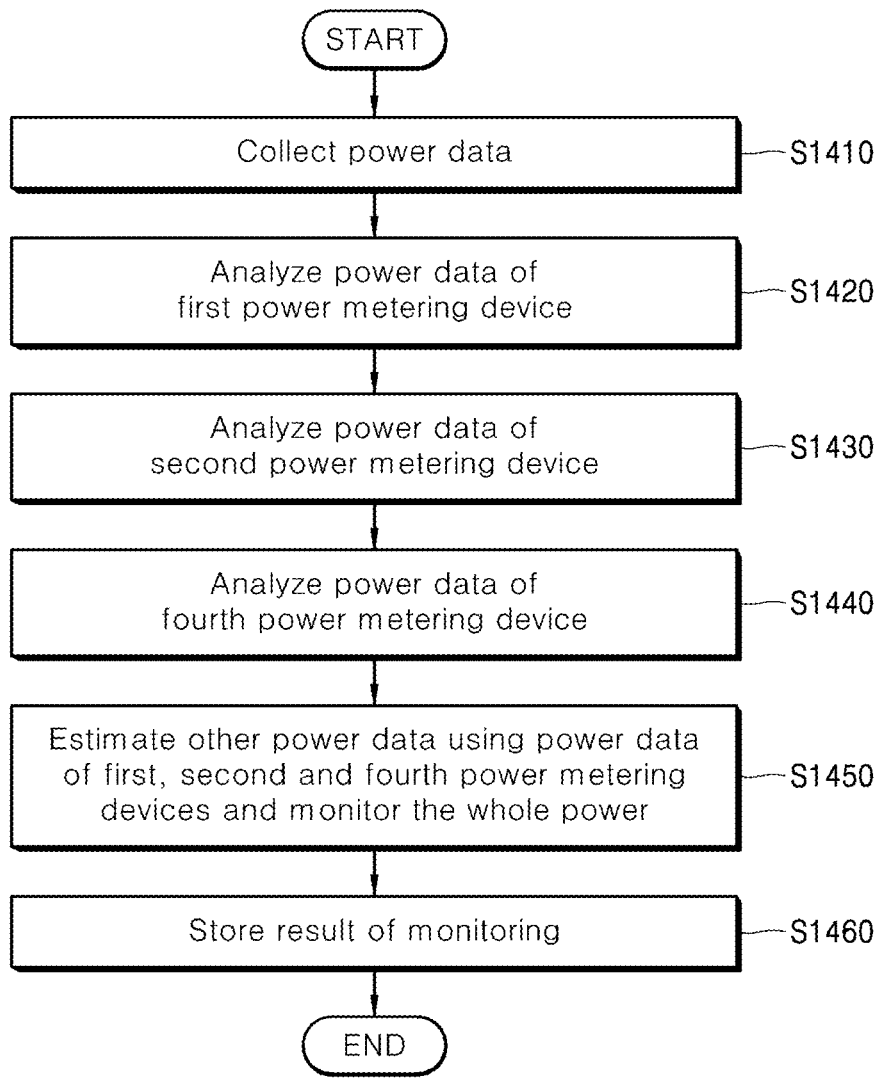
FIGS. 14 to 16 are flowcharts illustrating a method for monitoring power when an energy storage system operates in an AC charge mode according to some embodiments of the present disclosure.

FIG. 14 is a flowchart illustrating a method for monitoring power in the monitoring server 10 using first power data detected by the first power metering device, second power data detected by the second power metering device and fourth power data detected by the fourth power metering device when the ESS operates in an AC charge mode.

Referring to FIG. 14, the monitoring server 10 may collect power data via the communication unit 11 (S1410). Specifically, the monitoring server 10 may receive power data from the first power metering device 171 provided to the output of the external power supply source 110, the second power metering device 172 provided to the input of the distribution board 120, and the fourth power metering device 174 provided to the output of the renewable energy source 150.

In FIG. 11, the third power metering device 173 is illustrated as being provided to the input of the ESS 140. Since the third power data of the third power metering device 173 can be estimated based on the first power data, second power data and fourth power data, power may be monitored without using the third power data in some embodiments.

The controller 12 of the monitoring server 10 may analyze the first power data of the first power metering device 171 collected via the communication unit 11 (S1420).

In this case, the first power data may contain information about the amount of power applied from the external power supply source 110.

The controller 12 of the monitoring server 10 may analyze the second power data of the second power metering device 172 collected via the communication unit 11 (S1430).

The second power data may contain the total amount of power consumption of the plurality of electronic devices 130 and the ESS 140 and a total power consumption pattern. Further, the second power data may contain power consumption patterns of the individual electronic devices constituting the plurality of electronic devices 130 and the ESS 140.

The controller 12 of the monitoring server 10 may analyze the fourth power data of the fourth power metering device 174 collected via the communication unit 11 (S1440).

In this case, the fourth power data of the fourth power metering device 174 may contain the amount of power generated and applied to the ESS 140 by the renewable energy source 150, namely the amount of the DC power generated by the renewable energy source 150 and stored in the ESS 140.

The controller 12 of the monitoring server 10 may estimate the third power data based on the first power data detected by the first power metering device 171, the second power data detected by the second power metering device 172 and the fourth power data detected by the fourth power metering device 174, and monitor the power of the system (S1450).

Specifically, the controller 12 may acquire the amount of power applied from the external power supply source 110 using the first power data detected by the first power metering device 171. The controller 12 may also acquire at least one of the total amount of power consumption of the plurality of electronic devices 130 and the ESS 140, the amount of power consumption of each individual electronic device constituting the plurality of electronic devices 130, operational status information about the individual electronic devices, and operational status information about the ESS 140. The controller 12 may also acquire the amount of power applied from the renewable energy source 150 to the ESS 140, using the fourth power data of the fourth power metering device 174. Thereby, the controller 12 may acquire the amount of DC charge of the ESS 140. In this case, the NILM algorithm may be used.

Further, the controller 12 may acquire the amount of AC charge of the ESS by estimating the third power data using the first power data and second power data. Specifically, the controller 12 may acquire the amount of AC charge of the ESS 140 by subtracting the total amount of power consumption of the plurality of electronic devices 130 contained in the second power data from the amount of power applied from the external power supply source 110 contained in the first power data.

The controller 12 may store the result of monitoring and the operational status information about the ESS 140 in the storage unit 13 (S1460).

Figure 15:
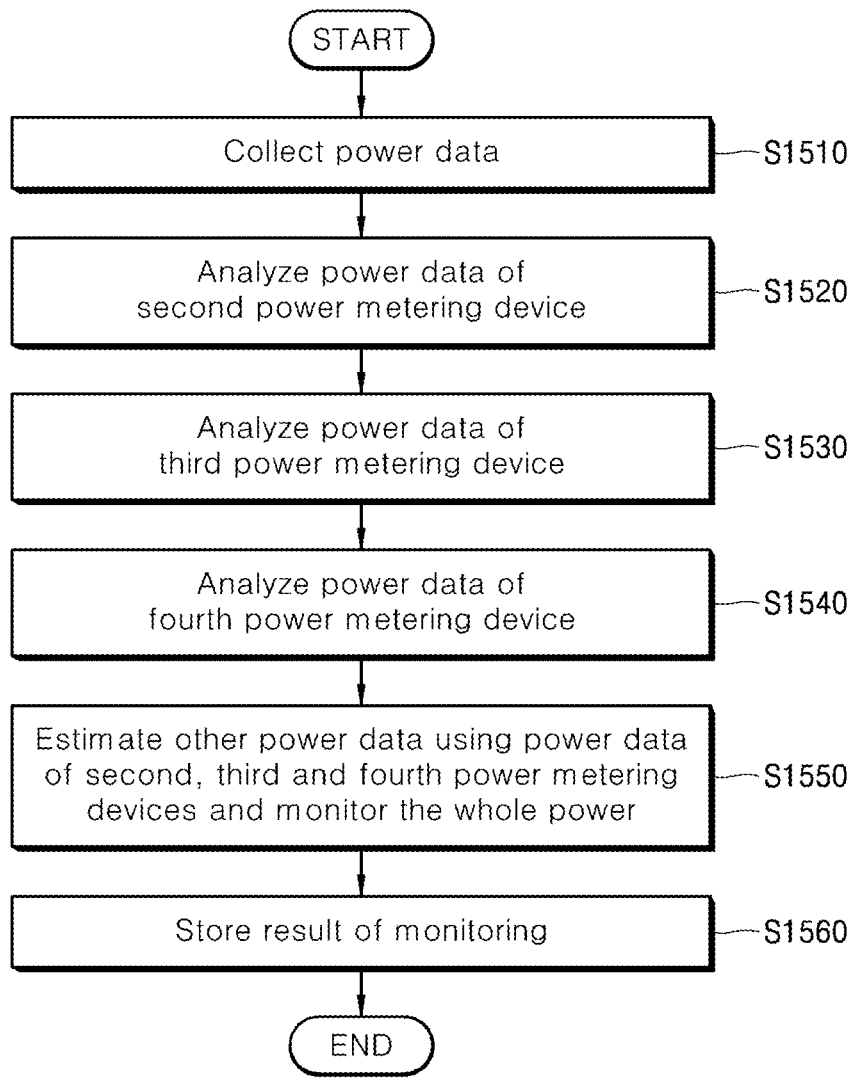

FIG. 15 is a flowchart illustrating a method for monitoring power in the monitoring server 10 using second power data detected by the second power metering device, third power data detected by the third power metering device, and fourth power data detected by the fourth power metering device when the ESS operates in the AC charge mode.

Referring to FIG. 15, the monitoring server 10 may collect power data via the communication unit 11 (S1510). Specifically, the monitoring server 10 may receive power data from the second power metering device 172 provided to the input of the distribution board 120, the third power metering device 173 provided to the input end of the ESS 140 and the fourth power metering device 174 provided to the output of the renewable energy source 150.

In FIG. 2, the first power metering device 171 is illustrated as being provided to the output of the external power supply source 110. However, since the first power data of the first power metering device 171 can be estimated based on the second power data, third power data and fourth power data, power may be monitored without using the first power data in some embodiments.

The controller 12 of the monitoring server 10 may analyze the second power data of the second power metering device 172 collected via the communication unit 11 (S1520).

The second power data may contain the total amount of power consumption of the plurality of electronic devices 130 and a total power consumption pattern. Further, the second power data may contain power consumption patterns of the individual electronic devices constituting the plurality of electronic devices 130 and the ESS 140.

The controller 12 of the monitoring server 10 may analyze the third power data of the third power metering device 173 collected via the communication unit 11 (S1530).

In this case, the third power data may contain information about the amount of AC power distributed from the distribution board 120 and applied to the ESS 140.

The controller 12 of the monitoring server 10 may analyze the fourth power data of the fourth power metering device 174 collected via the communication unit 11 (S1540).

In this case, the fourth power data of the fourth power metering device 174 may contain the amount of power generated and applied to the ESS 140 by the renewable energy source 150, namely the amount of the DC power generated by the renewable energy source 150 and stored in the ESS 140.

The controller 12 of the monitoring server 10 may estimate the first power data based on the second power data detected by the second power metering device 172, the third power data detected by the third power metering device 173 and the fourth power data detected by the fourth power metering device 174, and monitor the power of the system (S1550).

Specifically, the controller 12 may acquire at least one of the total amount of power consumption of the plurality of electronic devices 130, the amount of power consumption of each individual electronic device constituting the plurality of electronic devices 130 and the operational status information about the individual electronic devices, using the second power data detected by the second power metering device 172. The controller 12 may also acquire the amount of AC power supplied from the external power supply source 110 and applied to the ESS 140 to be stored in the ESS 140, using the third power data detected by the third power metering device 173. The controller 12 may also acquire the amount of power applied from the renewable energy source 150 to the ESS 140, using the fourth power data of the fourth power metering device 174. Thereby, the controller 12 may acquire the amount of DC charge of the ESS 140. In this case, the NILM algorithm may be used.

Further, the controller 12 may acquire the amount of power applied from the external power supply source 110 by estimating the first power data using the second power data and third power data. Specifically, the controller 12 may acquire the amount of power applied from the external power supply source 110 by adding the total amount of power consumption of the plurality of electronic devices 130 contained in the second power data to the amount of AC power stored in the ESS 140 contained in the third power data.

The controller 12 may store the result of monitoring and the operational status information about the ESS 140 in the storage unit 13 (S1560).

Figure 16:
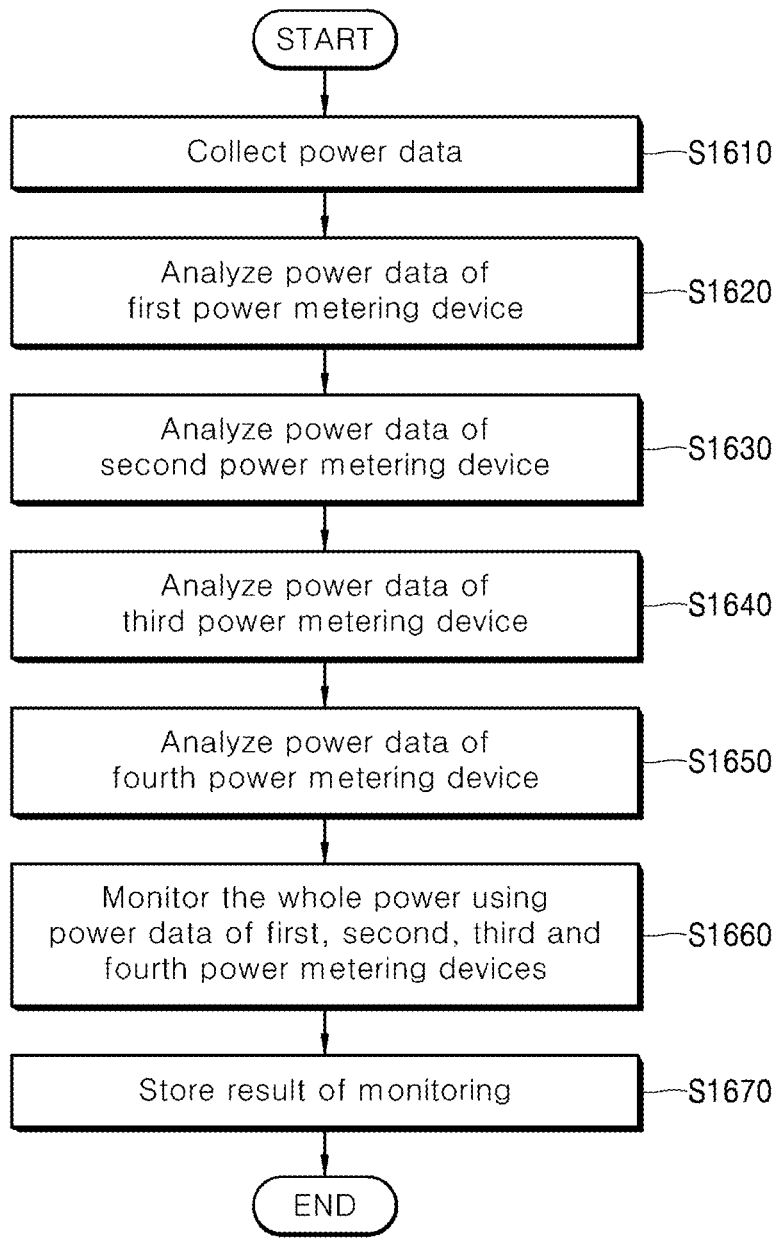

FIG. 16 is a flowchart illustrating a method for monitoring power in the monitoring server 10 using first power data detected by the first power metering device, second power data detected by the second power metering device, third power data detected by the third power metering device, and fourth power data detected by the fourth power metering device when the ESS operates in the AC charge mode.

Referring to FIG. 16, the monitoring server 10 may collect power data via the communication unit 11 (S1610). Specifically, the monitoring server 10 may receive power data from the first power metering device 171 provided to the output of the external power supply source 110, the second power metering device 172 provided to the input of the distribution board 120, the third power metering device 173 provided to the input end of the ESS 140 and the fourth power metering device 174 provided to the output of the renewable energy source 150.

The controller 12 of the monitoring server 10 may analyze the first power data of the first power metering device 171 collected via the communication unit 11 (S1620).

In this case, the first power data may contain information about the amount of power applied from the external power supply source 110. In other words, the first power data may contain information about the total amount of power consumed by the ESS 140 and a plurality of electronic devices 130.

The controller 12 of the monitoring server 10 may analyze the second power data of the second power metering device 172 collected via the communication unit 11 (S1630).

In this case, the second power data may contain the total amount of power consumption of the plurality of electronic devices 130 and the ESS 140 and a total power consumption pattern. Further, the second power data may contain power consumption patterns of the individual electronic devices constituting the plurality of electronic devices 130.

The controller 12 of the monitoring server 10 may analyze the third power data of the third power metering device 173 collected via the communication unit 11 (S1640).

In this case, the third power data may contain information about the amount of AC power distributed from the distribution board 120 and applied to the ESS 140.

The controller 12 of the monitoring server 10 may analyze the fourth power data of the fourth power metering device 174 collected via the communication unit 11 (S1650).

In this case, the fourth power data of the fourth power metering device 174 may contain the amount of power generated and applied to the ESS 140 by the renewable energy source 150, namely the amount of the DC power generated by the renewable energy source 150 and stored in the ESS 140.

The controller 12 of the monitoring server 10 may monitor the power of the system based on the first power data detected by the first power metering device 171, the second power data detected by the second power metering device 172, the third power data detected by the third power metering device 173 and the fourth power data detected by the fourth power metering device 174 (S1660).

Specifically, the controller 12 may acquire the amount of power applied from the external power supply source 110 using the first power data detected by the first power metering device 171. The controller 12 may also acquire at least one of the total amount of power consumption of the plurality of electronic devices 130, the amount of power consumption of each individual electronic device constituting the plurality of electronic devices 130 and the operational status information about the individual electronic devices, using the second power data detected by the second power metering device 172. The controller 12 may also acquire the amount of AC power supplied from the external power supply source 110 and applied to the ESS 140 to be stored in the ESS 140, using the third power data detected by the third power metering device 173. The controller 12 may also acquire the amount of power applied from the renewable energy source 150 to the ESS 140, using the fourth power data of the fourth power metering device 174. Thereby, the controller 12 may acquire the amount of DC charge of the ESS 140. In this case, the NILM algorithm may be used.

The controller 12 may store the result of monitoring and the operational status information about the ESS 140 in the storage unit 13 (S1670).

Hereinafter, a description will be given of a method for monitoring power in a monitoring server when the ESS 140 operates in a discharge mode (as a power generation source), with reference to FIGS. 17 to 19.

Figure 17:
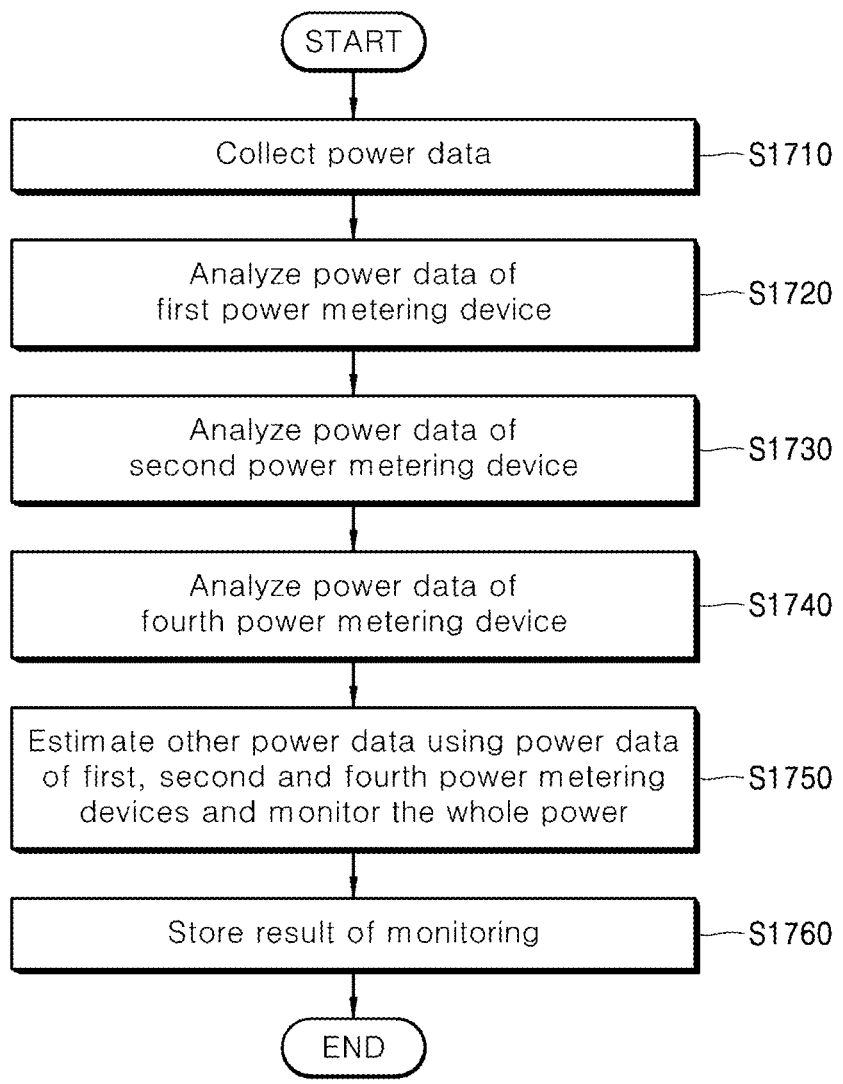
FIGS. 17 to 19 are flowcharts illustrating a method for monitoring power when an energy storage system operates in a discharge mode according to some embodiments of the present disclosure.

FIG. 17 is a flowchart illustrating a method for monitoring power in the monitoring server 10 using first power data detected by the first power metering device, second power data detected by the second power metering device and fourth power data detected by the fourth power metering device when the ESS operates in a discharge mode (as a power generation source).

Referring to FIG. 17, the monitoring server 10 may collect power data via the communication unit 11 (S1710). Specifically, the monitoring server 10 may receive power data from the first power metering device 171 provided to the output of the external power supply source 110, the second power metering device 172 provided to the input of the distribution board 120, and the fourth power metering device 174 provided to the output of the renewable energy source 150.

In FIG. 11, the third power metering device 173 is illustrated as being provided to the input of the ESS 140. However, since the third power data of the third power metering device 173 can be estimated based on the first power data, second power data and fourth power data, power may be monitored without using the third power data in some embodiments.

The controller 12 of the monitoring server 10 may analyze the first power data of the first power metering device 171 collected via the communication unit 11 (S1720).

In this case, the first power data may contain information about the amount of power applied from the external power supply source 110.

The controller 12 of the monitoring server 10 may analyze the second power data of the second power metering device 172 collected via the communication unit 11 (S1730).

The second power data may contain the total amount of power consumption of the plurality of electronic devices 130 and a total power consumption pattern. Further, the second power data may contain power consumption patterns of the individual electronic devices constituting the plurality of electronic devices 130.

The controller 12 of the monitoring server 10 may analyze the fourth power data of the fourth power metering device 174 collected via the communication unit 11 (S1740).

In this case, the fourth power data of the fourth power metering device 174 may contain the amount of power generated and applied to the ESS 140 by the renewable energy source 150, namely the amount of the DC power generated by the renewable energy source 150 and stored in the ESS 140.

The controller 12 of the monitoring server 10 may estimate the third power data based on the first power data detected by the first power metering device 171, the second power data detected by the second power metering device 172 and the fourth power data detected by the fourth power metering device 174, and monitor the power of the system (S1750).

Specifically, the controller 12 may acquire the amount of power applied from the external power supply source 110 using the first power data detected by the first power metering device 171. The controller 12 may also acquire at least one of the total amount of power consumption of the plurality of electronic devices 130, the amount of power consumption of each individual electronic device constituting the plurality of electronic devices 130 and the operational status information about the individual electronic devices, using the second power data detected by the second power metering device 172. The controller 12 may also acquire the amount of power applied from the renewable energy source 150 to the ESS 140, using the fourth power data of the fourth power metering device 174. Thereby, the controller 12 may acquire the amount of DC charge of the ESS 140. In this case, the NILM algorithm may be used.

Further, the controller 12 may acquire the amount of AC discharge of the ESS by estimating the third power data using the first power data and second power data. Specifically, the controller 12 may acquire the amount of AC discharge of the ESS 140 by subtracting the amount of power applied from the external power supply source 110 contained in the first power data from the total amount of power consumption of the plurality of electronic devices 130 contained in the second power data.

The controller 12 may store the result of monitoring and the operational status information about the ESS 140 in the storage unit 13 (S1760).

Figure 18:
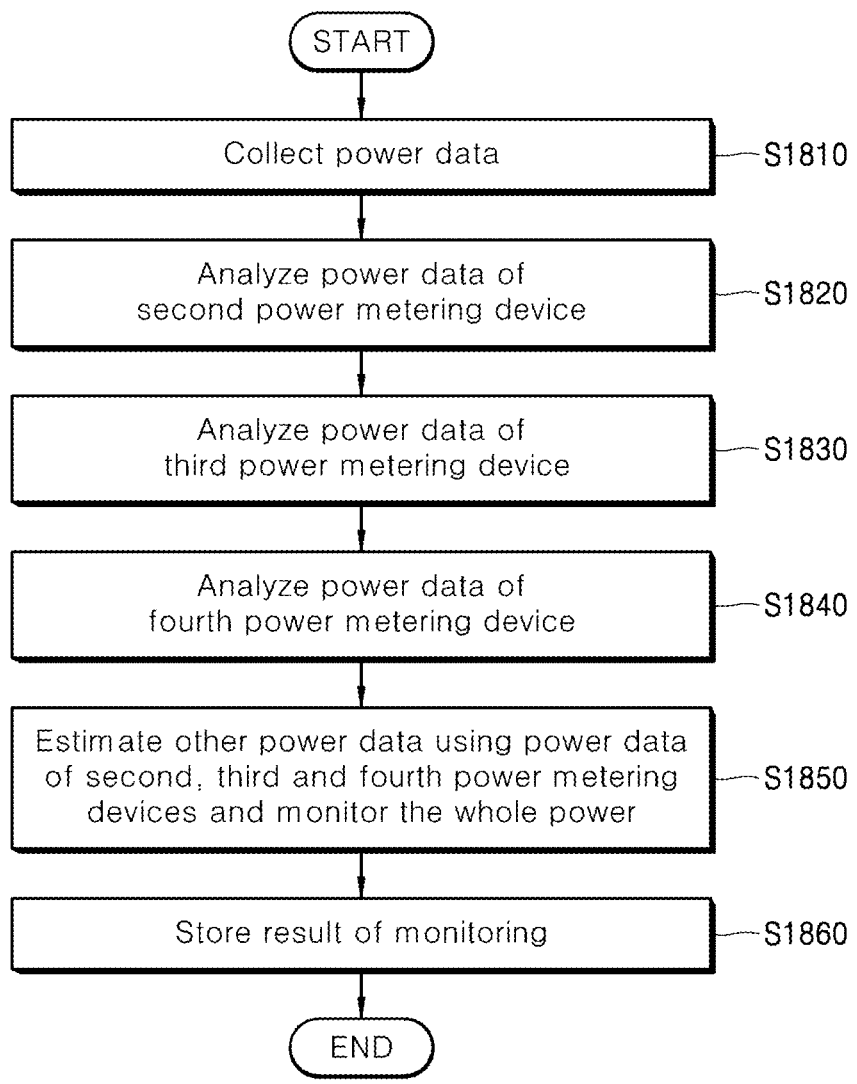

FIG. 18 is a flowchart illustrating a method for monitoring power in the monitoring server 10 using second power data detected by the second power metering device, third power data detected by the third power metering device, and fourth power data detected by the fourth power metering device when the ESS operates in a discharge mode (as a power generation source).

Referring to FIG. 18, the monitoring server 10 may collect power data via the communication unit 11 (S1810) Specifically, the monitoring server 10 may receive power data from the second power metering device 172 provided to the input of the distribution board 120, the third power metering device 173 provided to the input end of the ESS 140 and the fourth power metering device 174 provided to the output of the renewable energy source 150.

In FIG. 18, the first power metering device 171 is illustrated as being provided to the output of the external power supply source 110. However, since the first power data of the first power metering device 171 can be estimated based on the second power data, third power data and fourth power data, power may be monitored without using the first power data in some embodiments.

The controller 12 of the monitoring server 10 may analyze the second power data of the second power metering device 172 collected via the communication unit 11 (S1820).

In this case, the second power data may contain the total amount of power consumption of the plurality of electronic devices 130 and a total power consumption pattern. Further, the second power data may contain power consumption patterns of the individual electronic devices constituting the plurality of electronic devices 130.

The controller 12 of the monitoring server 10 may analyze the third power data of the third power metering device 173 collected via the communication unit 11 (S1830).

In this case, the third power data may contain information about the amount of AC power supplied from the external power supply source 110 and applied to the ESS 140. In other words, the third power data may contain information about the amount of AC power discharged from the ESS 140 and applied to the electronic devices 130.

The controller 12 of the monitoring server 10 may analyze the fourth power data of the fourth power metering device 174 collected via the communication unit 11 (S1840).

In this case, the fourth power data of the fourth power metering device 174 may contain the amount of power generated and applied to the ESS 140 by the renewable energy source 150, namely the amount of the DC power generated by the renewable energy source 150 and stored in the ESS 140.

The controller 12 of the monitoring server 10 may estimate the first power data based on the second power data detected by the second power metering device 172, the third power data detected by the third power metering device 173 and the fourth power data detected by the fourth power metering device 174, and monitor the power of the system (S1850).

Specifically, the controller 12 may acquire at least one of the total amount of power consumption of the plurality of electronic devices 130, the amount of power consumption of each individual electronic device constituting the plurality of electronic devices 130 and the operational status information about the individual electronic devices, using the second power data detected by the second power metering device 172. The controller 12 may also acquire the amount of AC power discharged from the ESS 140 and supplied to the electronic devices 130, using the third power data detected by the third power metering device 173. The controller 12 may also acquire the amount of power applied from the renewable energy source 150 to the ESS 140, using the fourth power data of the fourth power metering device 174. Thereby, the controller 12 may acquire the amount of DC charge of the ESS 140. In this case, the NILM algorithm may be used.

Further, the controller 12 may acquire the amount of power applied from the external power supply source 110 by estimating the first power data using the second power data and third power data. Specifically, the controller 12 may acquire the amount of power applied from the external power supply source 110 by subtracting the amount of AC power discharged from the ESS 140 from the total amount of power consumption of the plurality of electronic devices 130 contained in the second power data.

The controller 12 may store the result of monitoring and the operational status information about the ESS 140 in the storage unit 13 (S1860).

Figure 19:
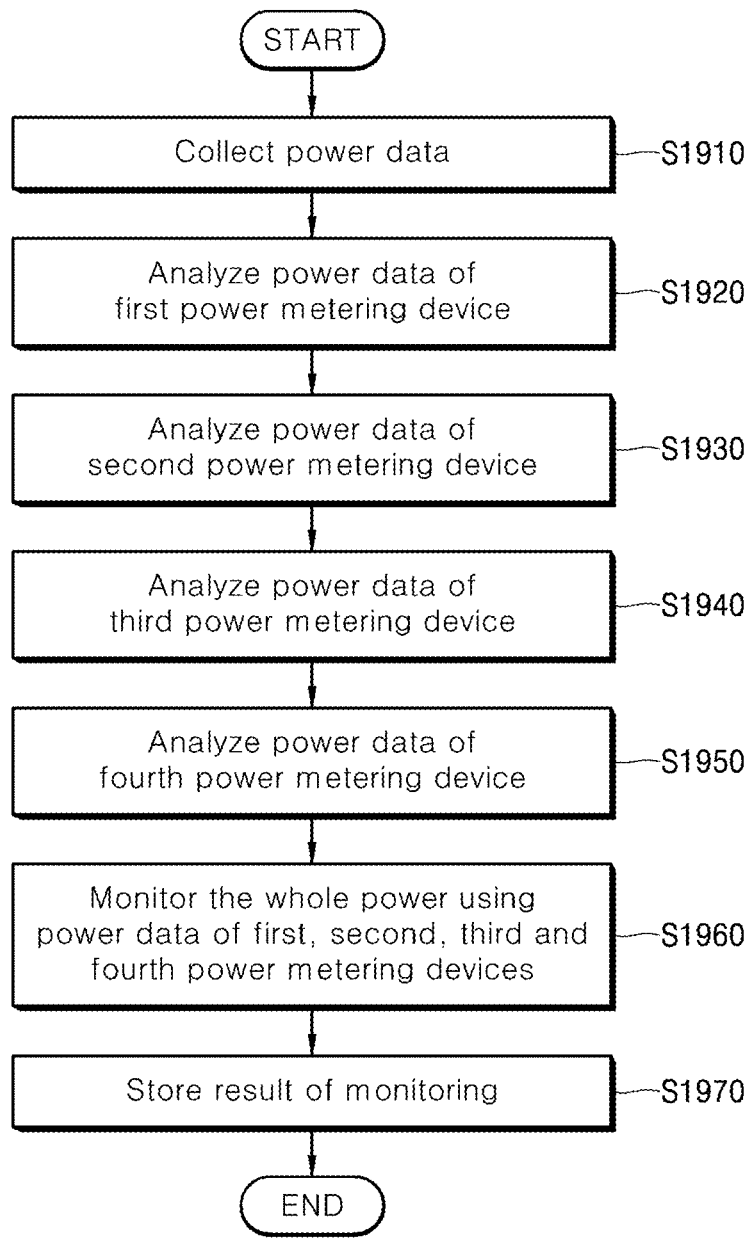

FIG. 19 is a flowchart illustrating a method for monitoring power in the monitoring server 10 using first power data detected by the first power metering device, second power data detected by the second power metering device, third power data detected by the third power metering device, and fourth power data detected by the fourth power metering device when the ESS operates in a discharge mode (as a power generation source).

Referring to FIG. 19, the monitoring server 10 may collect power data via the communication unit 11 (S1910). Specifically, the monitoring server 10 may receive power data from the first power metering device 171 provided to the output of the external power supply source 110, the second power metering device 172 provided to the input of the distribution board 120, the third power metering device 173 provided to the input end of the ESS 140 and the fourth power metering device 174 provided to the output of the renewable energy source 150.

The controller 12 of the monitoring server 10 may analyze the first power data of the first power metering device 171 collected via the communication unit 11 (S1920).

In this case, the first power data may contain information about the amount of power applied from the external power supply source 110.

The controller 12 of the monitoring server 10 may analyze the second power data of the second power metering device 172 collected via the communication unit 11 (S1930).

In this case, the second power data may contain the total amount of power consumption of the plurality of electronic devices 130 and a total power consumption pattern. Further, the second power data may contain power consumption patterns of the individual electronic devices constituting the plurality of electronic devices 130.

The controller 12 of the monitoring server 10 may analyze the third power data of the third power metering device 173 collected via the communication unit 11 (S1940).

In this case, the third power data may contain information about the amount of AC power distributed from the distribution board 120 and applied to the ESS 140. In other words, the third power data may contain information about the amount of AC power discharged from the ESS 140 and applied to the electronic devices 130.

The controller 12 of the monitoring server 10 may analyze the fourth power data of the fourth power metering device 174 collected via the communication unit 11 (S1950).

In this case, the fourth power data of the fourth power metering device 174 may contain the amount of power generated and applied to the ESS 140 by the renewable energy source 150, namely the amount of the DC power generated by the renewable energy source 150 and stored in the ESS 140.

The controller 12 of the monitoring server 10 may monitor the power of the system based on the first power data detected by the first power metering device 171, the second power data detected by the second power metering device 172, the third power data detected by the third power metering device 173 and the fourth power data detected by the fourth power metering device 174 (S1960).

Specifically, the controller 12 may acquire the amount of power applied from the external power supply source 110 using the first power data detected by the first power metering device 171. The controller 12 may also acquire at least one of the total amount of power consumption of the plurality of electronic devices 130, the amount of power consumption of each individual electronic device constituting the plurality of electronic devices 130 and the operational status information about the individual electronic devices, using the second power data detected by the second power metering device 172. The controller 12 may also acquire the amount of AC power discharged from the ESS 140 and supplied to the electronic devices 130, using the third power data detected by the third power metering device 173. The controller 12 may also acquire the amount of power applied from the renewable energy source 150 to the ESS 140, using the fourth power data of the fourth power metering device 174. Thereby, the controller 12 may acquire the amount of DC charge of the ESS 140. In this case, the NILM algorithm may be used.

The controller 12 may store the result of monitoring and the operational status information about the ESS 140 in the storage unit 13 (S1970).

Since some embodiments in the present disclosure can obtain the amount of power supplied from the external power supply source 110, the amount of charge of the ESS 140, the amount of discharge of the ESS 140, the amount of discharge of the renewable energy source 150, the total amount of power consumption of the plurality of electronic devices 130, the amount of power consumed by each individual electronic device, and operational status information about the individual electronic devices using the first power metering device 171, the second power metering device 172, the third power metering device 173 and the fourth power metering device 174 as described above, it is possible to comprehensively monitor power production and consumption.

Further, with some embodiments in the present disclosure, it is possible to estimate the amount of power supplied from the external power supply source 110 and the amount of power used in the ESS 140 even if one or more of the first power metering device 171, the second power metering device 172 and the third power metering device 173 are not provided. Accordingly, it is possible to comprehensively monitor power production and consumption irrespective of malfunction or maintenance of any of the plurality of power metering devices.

Further, as the first power metering device 171, the second power metering device 172, the third power metering device 173 and the fourth power metering device 174 are all used, the power in the system may be monitored with a minimized error.

Figure 21:
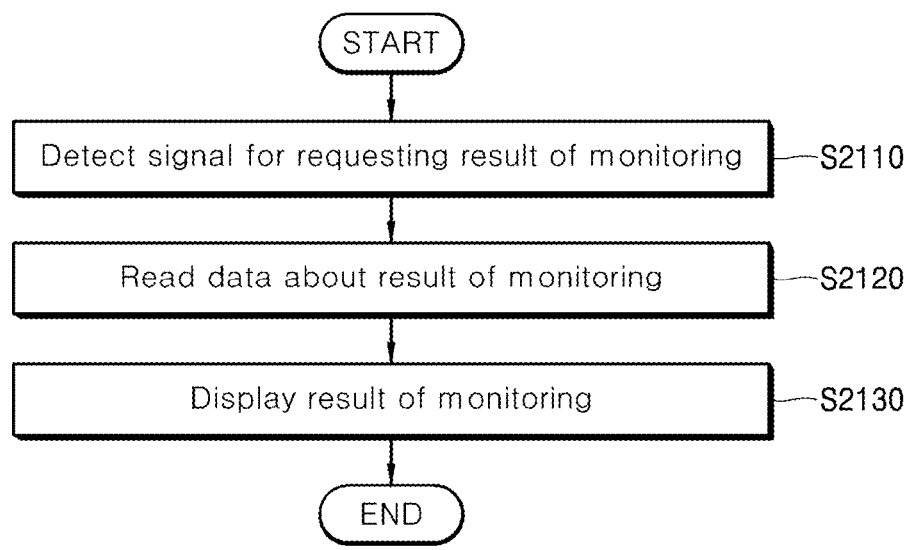
FIG. 21 is a flowchart illustrating an operation of outputting a result of power monitoring according to some embodiments of the present disclosure and FIG. 22 shows output of the result of power monitoring according to some embodiments of the present disclosure.
Figure 22:
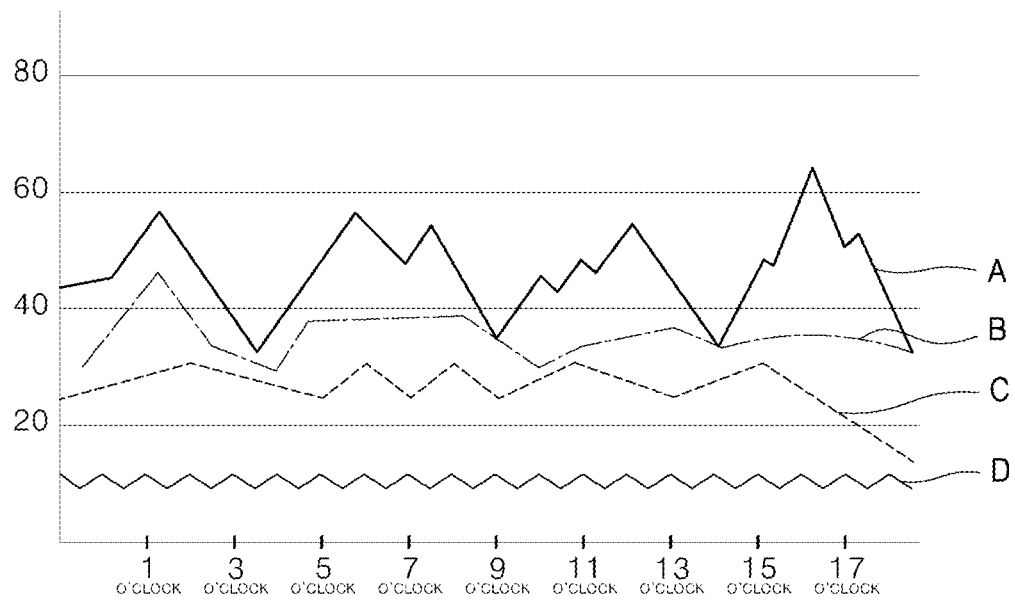

FIG. 21 is a flowchart illustrating an operation of outputting a result of power monitoring according to some embodiments of the present disclosure, and FIG. 22 shows outputting of the result of power monitoring according to some embodiments of the present disclosure.

Hereinafter, a detailed description will be given of an operation of outputting a result of power monitoring stored in the storage unit 13 of the monitoring server 10 according to some embodiments of the present disclosure, with reference to FIGS. 21 and 22.

Referring to FIGS. 21 and 22, the controller 12 of the monitoring server 10 may detect a signal for requesting output of the result of monitoring measured, obtained and stored in the storage unit 13 in accordance with some embodiments, some embodiments and yet some embodiments of the present disclosure (S2110). The output request signal may be input through a user input unit (not shown) or received from a remote terminal in a wired or wireless manner.

The controller 12 of the monitoring server 10 may extract the result of monitoring stored in the storage unit 13 (S1520), and display power data in various forms such as graphs, numerals and texts as shown in FIG. 21 (S2120). FIG. 22 depicts information about the amount of power consumption or amount of charge electronic devices and ESS. In the example, A to C represent an example of the amounts of power of the home appliances 130, and D represents an example of the amount of power of the ESS 140. For the amounts of power of home appliances, the cycle of the amounts of power may be short as the power data required for NILM analysis are detected.

In some embodiments of the present disclosure, the operations for measuring or estimating power data in the external power supply source 110, the distribution board 120, the electronic devices 130, the ESS 140 and the renewable energy source 150 are described in a sequential order. However, it should be noted that order of the operations for estimating or measuring the aforementioned power data is not limited thereto, and may be varied in various forms and performed.

According to some embodiments of the present disclosure, as an ESS and a renewable energy source are provided in addition to a conventional external power supply source, the consumption state of power supplied to the loads and the power production state of the ESS and renewable energy source may be comprehensively monitored.

While the embodiments of the present disclosure have been shown and described, it should be noted that the spirit of the present disclosure is not limited to the specific embodiments described above. Those skilled in the art will appreciate that various changes and modifications can be made to the disclosure, without departing from the scope and spirit of the of the present disclosure as defined in the accompanying claims. It should be noted that the aforementioned changes and modifications shall not be understood individually as being different from the spirit or prospects of the present disclosure. Various components illustrated in the figures may be implemented as hardware and/or software and/or firmware on a processor, ASIC/FPGA, dedicated hardware, and/or logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A power monitoring system comprising:
an external power supply source configured to apply power;
a renewable energy source configured to generate power and apply the generated power to an energy storage system (ESS), the ESS configured to store at least one of the power applied by the external power supply source and the power applied by the renewable energy source;
a distribution board configured to distribute the power applied from at least one of the external power supply source and the ESS, wherein the power is applied to at least one of a load and the ESS;
a first power metering device connected to an output of the external power supply source and configured to detect first power data applied from the external power supply source;
a second power metering device connected to an input of the distribution board and configured to detect second power data distributed to at least one of the load and the ESS;
a third power metering device connected to an input of the ESS and configured to detect third power data applied to the ESS;
a fourth power metering device connected to an output of the renewable energy source and configured to detect fourth power data applied from the renewable energy source to the ESS, wherein the ESS is configured to be operated in one of a direct current (DC) charge mode, an alternating current (AC) charge mode or a discharge mode; and
a server configured to monitor power based on at least one of the first power data, the second power data, the third power data and the fourth power data when the ESS is operated in one of the DC charge mode, the AC charge mode and the discharge mode,
wherein the DC charge mode is a mode in which the ESS does not store power applied from the external power supply source, but stores only DC power applied from the renewable energy source,
wherein the AC charge mode is a mode in which the ESS stores AC power applied from the external power supply source as well as DC power applied from the renewable energy source,
wherein the discharge mode is a mode in which the ESS stores DC power applied from the renewable energy source and discharges the charged power,
wherein, when the ESS is in the DC charge mode, the server is configured to acquire the amount of power consumption of the load using the first power data or the second power data, to acquire the amount of DC charge of the ESS using the fourth power data, and to estimate the third power data based on the first power data and the second power data, wherein the server estimates no applied power for the third power data based on the second power data being identical to the first power data, and
wherein, when the ESS is in the AC charge mode, the server is configured to acquire the amount of power consumption of the load and the amount of AC charge of the ESS, using the second power data and at least one of the first power data and the third power data, to acquire the amount of DC charge of the ESS using the fourth power data, and to estimate the first power data based on adding the second power data to the third power data.

2. The power monitoring system according to claim 1, wherein, when the ESS is in the discharge mode, the server is configured to acquire the amount of power consumption of the load and the amount of AC discharge of the ESS, using at least one of the first power data and the third power data, and the second power data, and
to acquire the amount of DC charge of the ESS using the fourth power data.

3. The power monitoring system according to claim 1, wherein the second power data contains a power consumption pattern of at least one of the load and the ESS,
wherein the server is configured to acquire the amount of power consumed by the load by analyzing the second power data using a non-intrusive load monitoring (NILM) algorithm.

4. The power monitoring system according to claim 1, wherein the renewable energy source is a photovoltaic power generation system.

5. A power monitoring system comprising:
an external power supply source configured to apply power;
a distribution board configured to distribute the power applied from the external power supply source to an energy storage system (ESS), at least one load, or both;
a renewable energy source configured to generate power and apply the generated power to the ESS, the ESS configured to store at least one of the power applied by the external power supply source via the distribution board and the power applied by the renewable energy source and to apply the stored power to the load via the distribution board;
a first power metering device connected to an output of the external power supply source and configured to detect first power data applied from the external power supply source;
a second power metering device connected to an input of the distribution board and configured to detect second power data distributed to at least one of the load and the ESS;
a third power metering device connected to an input of the ESS and configured to detect third power data distributed from the distribution board and applied to the ESS;
a fourth power metering device connected to an output of the renewable energy source and configured to detect fourth power data applied from the renewable energy source to the ESS; and
a server configured to monitor power based on at least one of the first power data, the second power data, the third power data and the fourth power data when the ESS is operated in one of a direct current (DC) charge mode, an alternating current (AC) charge mode or a discharge mode,
wherein the DC charge mode is a mode in which the ESS does not store power applied from the external power supply source, but stores only DC power applied from the renewable energy source,
wherein the AC charge mode is a mode in which the ESS stores AC power applied from the external power supply source as well as DC power applied from the renewable energy source, wherein the discharge mode is a mode in which the ESS stores DC power applied from the renewable energy source and discharges the charged power, wherein, when the ESS is in the DC charge mode, the server is configured to acquire the amount of power consumption of the load using the first power data or the second power data, to acquire the amount of DC charge of the ESS using the fourth power data, and to estimate the third power data based on the first power data and the second power data, wherein the server estimates no applied power for the third power data based on the second power data being identical to the first power data, and wherein, when the ESS is in the AC charge mode, the server is configured to acquire the amount of power consumption of the load and the amount of AC charge of the ESS, using the second power data and at least one of the first power data and the third power data, to acquire the amount of DC charge of the ESS using the fourth power data, and to estimate the first power data based on adding the second power data to the third power data.

6. The power monitoring system according to claim 5, wherein, when the ESS is in the discharge mode, the server is configured to acquire the amount of power consumption of the load and the amount of AC discharge of the ESS, using at least one of the first power data and the third power data, and the second power data, and to acquire the amount of DC charge of the ESS using the fourth power data.

7. The power monitoring system according to claim 5, wherein the second power data contains a power consumption pattern of at least one of the load and the ESS, wherein the server is configured to acquire the amount of power consumed by at least one of the load and the ESS by analyzing the second power data using a non-intrusive load monitoring (NILM) algorithm.

8. The power monitoring system according to claim 5, wherein the renewable energy source is a photovoltaic power generation system.

* * * * *